United States Patent
Majhi et al.

(10) Patent No.: US 11,640,995 B2
(45) Date of Patent: May 2, 2023

(54) FERROELECTRIC FIELD EFFECT TRANSISTORS (FEFETS) HAVING BAND-ENGINEERED INTERFACE LAYER

(71) Applicant: Intel Corporation, Santa Clara, CA (US)

(72) Inventors: Prashant Majhi, San Jose, CA (US); Brian S. Doyle, Portland, OR (US); Kevin P. O'Brien, Portland, OR (US); Abhishek A. Sharma, Hillsboro, OR (US); Elijah V. Karpov, Portland, OR (US); Kaan Oguz, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 161 days.

(21) Appl. No.: 16/616,373

(22) PCT Filed: Jun. 20, 2017

(86) PCT No.: PCT/US2017/038387
§ 371 (c)(1),
(2) Date: Nov. 22, 2019

(87) PCT Pub. No.: WO2018/236361
PCT Pub. Date: Dec. 27, 2018

(65) Prior Publication Data
US 2020/0105940 A1   Apr. 2, 2020

(51) Int. Cl.
*H01L 29/78*   (2006.01)
*H01L 27/24*   (2006.01)
(Continued)

(52) U.S. Cl.
CPC ...... *H01L 29/78391* (2014.09); *H01L 27/228* (2013.01); *H01L 27/2436* (2013.01);
(Continued)

(58) Field of Classification Search
None
See application file for complete search history.

(56) References Cited

U.S. PATENT DOCUMENTS 5,659,184 A   8/1997   Tokunaga et al.
9,159,829 B1 *  10/2015   Ramaswamy ...... H01L 29/6684
(Continued)

OTHER PUBLICATIONS

International Search Report and Written Opinion for International Patent Application No. PCT/US2017/038387 dated Feb. 13, 2018, 16 pgs.
(Continued)

*Primary Examiner* — Xiaoming Liu
(74) *Attorney, Agent, or Firm* — Schwabe, Williamson & Wyatt P.C.

(57) ABSTRACT

Ferroelectric field effect transistors (FeFETs) having band-engineered interface layers are described. In an example, an integrated circuit structure includes a semiconductor channel layer above a substrate. A metal oxide material is on the semiconductor channel layer, the metal oxide material having no net dipole. A ferroelectric oxide material is on the metal oxide material. A gate electrode is on the ferroelectric oxide material, the gate electrode having a first side and a second side opposite the first side. A first source/drain region is at the first side of the gate electrode, and a second source/drain region is at the second side of the gate electrode.

24 Claims, 11 Drawing Sheets

(51) Int. Cl.
| | |
|---|---|
| H01L 29/06 | (2006.01) |
| H01L 29/51 | (2006.01) |
| H01L 21/28 | (2006.01) |
| H01L 27/22 | (2006.01) |
| H01L 29/423 | (2006.01) |
| H01L 29/49 | (2006.01) |
| H01L 29/66 | (2006.01) |
| H01L 29/786 | (2006.01) |

(52) U.S. Cl.
CPC .... *H01L 29/0673* (2013.01); *H01L 29/40111* (2019.08); *H01L 29/42392* (2013.01); *H01L 29/4908* (2013.01); *H01L 29/513* (2013.01); *H01L 29/516* (2013.01); *H01L 29/517* (2013.01); *H01L 29/6684* (2013.01); *H01L 29/66757* (2013.01); *H01L 29/66795* (2013.01); *H01L 29/785* (2013.01); *H01L 29/78666* (2013.01); *H01L 29/78675* (2013.01); *H01L 29/78696* (2013.01)

(56) References Cited

U.S. PATENT DOCUMENTS

| | | | |
|---|---|---|---|
| 9,548,450 | B2 | 1/2017 | Pandey et al. |
| 9,722,093 | B1* | 8/2017 | Xing ................... H01L 29/4908 |
| 2006/0221687 | A1 | 10/2006 | Banks |
| 2009/0061538 | A1 | 3/2009 | Heo et al. |
| 2015/0340237 | A1* | 11/2015 | Rezanezhad Gatabi .................... H01L 29/423 438/283 |
| 2016/0197173 | A1 | 7/2016 | Dewey et al. |
| 2017/0162587 | A1* | 6/2017 | Chavan ................ H01L 29/516 |
| 2017/0162702 | A1* | 6/2017 | Hu ................... H01L 29/42384 |
| 2019/0058049 | A1* | 2/2019 | Then ................... H01L 29/2003 |

OTHER PUBLICATIONS

International Preliminary Report on Patentability for International Patent Application No. PCT/US2017/038387, dated Jan. 2, 2020, 12 pgs.

\* cited by examiner

FERROELECTRIC FIELD EFFECT TRANSISTORS (FEFETS) HAVING BAND-ENGINEERED INTERFACE LAYER

CROSS-REFERENCE TO RELATED APPLICATION

This patent application is a U.S. National Phase Application under 35 U.S.C. § 371 of International Application No. PCT/US2017/038387, filed Jun. 20, 2017, entitled "FERROELECTRIC FIELD EFFECT TRANSISTORS (FEFETS) HAVING BAND-ENGINEERED INTERFACE LAYER," which designates the United States of America, the entire disclosure of which is hereby incorporated by reference in its entirety and for all purposes.

TECHNICAL FIELD

Embodiments of the disclosure are in the field of integrated circuit structures and, in particular, ferroelectric field effect transistors (FeFETs) having band-engineered interface layers.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips.

For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant. In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure. Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

The performance of a thin-film transistor (TFT) may depend on a number of factors. For example, the efficiency at which a TFT is able to operate may depend on the sub threshold swing of the TFT, characterizing the amount of change in the gate-source voltage needed to achieve a given change in the drain current. A smaller sub threshold swing enables the TFT to turn off to a lower leakage value when the gate-source voltage drops below the threshold voltage of the TFT.

Variability in conventional and state-of-the-art fabrication processes may limit the possibility to further extend them into the, e.g. 10 nm or sub-10 nm range. Consequently, fabrication of the functional components needed for future technology nodes may require the introduction of new methodologies or the integration of new technologies in current fabrication processes or in place of current fabrication processes.

DESCRIPTION OF THE EMBODIMENTS

Figure 1A:
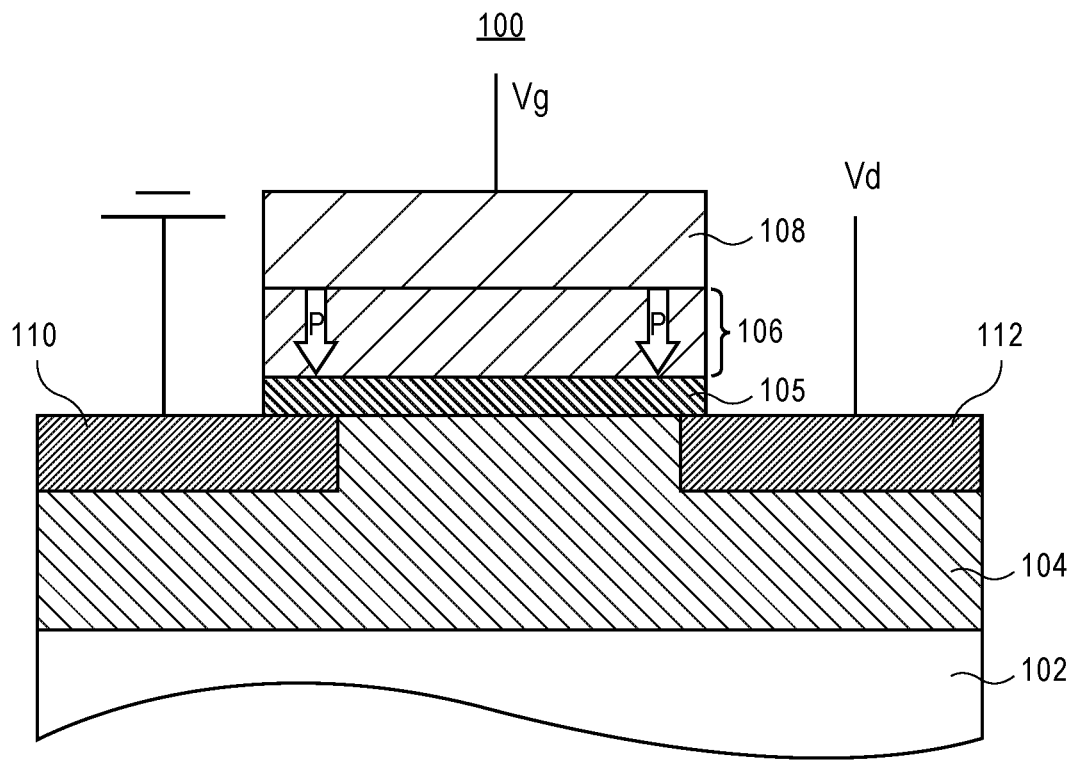
FIGS. 1A and 1B illustrate cross-sectional views of two different states of a ferroelectric field effect transistor (FeFET), in accordance with an embodiment of the present disclosure.

Ferroelectric field effect transistors (FeFETs) having band-engineered interface layers are described. In the following description, numerous specific details are set forth, such as specific material and structural regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to ferroelectric field effect transistors including metal oxide interface layers. Embodiments may be directed to bulk substrate or single crystalline channels for ferroelectric field effect transistors. Embodiments may be directed to polycrystalline or amorphous channels for ferroelectric field effect transistors. Embodiments may be directed to BEOL thin film ferroelectric field effect transistors. Embodiments may include or pertain to one or more of back end transistors, or high performance FeFET for, e.g., embedded non-volatile memory (eNVM). In one embodiment, an FeFET described herein can be used as a stand-alone two-state memory. In another embodiment, an FeFET described herein is used as a select transistor for, e.g., non-volatile memory.

In accordance with one or more embodiments described herein, FeFETs with band-engineered interface layers have a planar geometry or a non-planar geometry. Non-planar transistor geometries can include but are not limited to FIN-FET, tri-gate, or gate-all-around (GAA) nanowires. A thin film transistor (TFT) fabricated based on one of the above architectures may exhibit an increase in gate control, stability, and performance of thin film transistors. Applications of such FeFETs may include, but are not limited to, back end (BEOL) logic, memory, or analog applications.

Figure 1B:
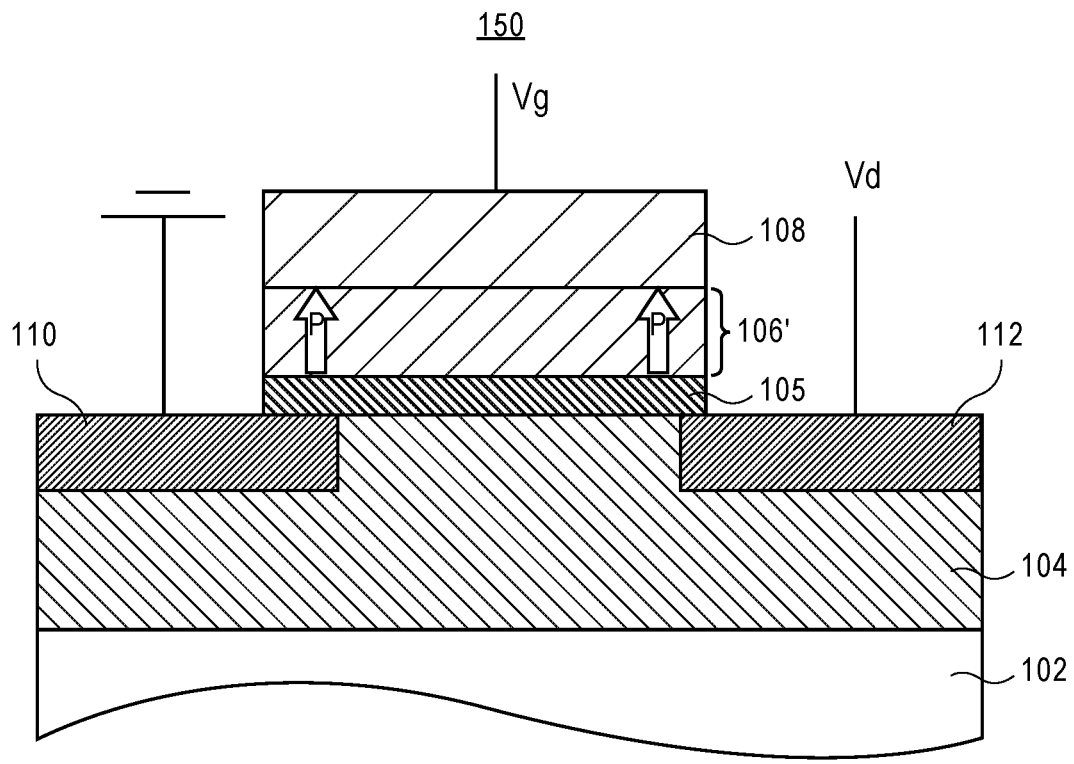

As a first exemplary ferroelectric field effect transistor structure, FIGS. 1A and 1B illustrate cross-sectional views of two different states of a ferroelectric field effect transistor (FeFET), in accordance with an embodiment of the present disclosure.

Referring to FIG. 1A, an integrated circuit structure 100 includes a semiconductor channel layer 104 above a substrate 102. A metal oxide material 105 is on the semiconductor channel layer 104. The metal oxide material 105 has no net dipole, as is explained in greater detail below. A ferroelectric oxide material 106 is on the metal oxide material 105. A gate electrode 108 is on the ferroelectric oxide material 106. The gate electrode 108 has a first side and a second side opposite the first side. A first source/drain region 110 is at the first side of the gate electrode 108, and a second source/drain region 112 is at the second side of the gate electrode 108. In the state shown for FIG. 1A, Id is high, and a state "1" is read.

Referring to FIG. 1B, the integrated circuit structure of FIG. 1A is shown as integrated circuit structure 150, where Id is low, and a state "0" is read. To program the cell 100/150, a positive or negative gate voltage (Vg) is applied to switch polarization (P) of the ferroelectric layer downward (layer 106 of FIG. 1A) or upward (layer 106' of FIG. 1B), respectively, as is depicted in FIGS. 1A and 1B.

Referring to both FIGS. 1A and 1B, in an embodiment, the semiconductor channel layer 104 is a single crystalline semiconductor channel layer, such as a single crystalline silicon layer.

In another embodiment, the semiconductor channel layer 104 is an amorphous or a polycrystalline semiconductor channel layer, such as an amorphous or a polycrystalline silicon layer. In an embodiment, the metal oxide material 106 is selected from the group consisting of magnesium oxide, lanthanum aluminum oxide and aluminum oxide. In an embodiment, the material of the semiconductor channel layer 104 is a Group IV material system, such as silicon, silicon germanium, or germanium. In another embodiment, the material of the semiconductor channel layer 104 is a Group III-V material system, such as indium gallium arsenide (InGaAs).

In an embodiment, the ferroelectric oxide material 106/106' is selected from the group consisting of lead zirconate titanate (PZT), strontium bismuth tantalum oxide (SBT), and lanthanum-doped lead zirconium titanate (PLZT). In another embodiment, the ferroelectric oxide material 106/106' includes hafnium and oxygen. In one such embodiment, a hafnium oxide material having a structural geometry that provides for a switchable polarization direction is used as the ferroelectric oxide material 106/106'.

In an embodiment, the integrated circuit structure 100/150 is a two-state memory cell, as described above. In another embodiment, the integrated circuit structure 100/150 further includes a non-volatile memory cell coupled to the second source/drain region 112, examples of which are provided below. In one such embodiment, the non-volatile memory cell is selected from the group consisting of a spin torque transfer random access memory (STTRAM) cell, a resistive random access memory (RRAM) cell, and a conductive bridge random access memory (CBRAM) cell, examples of which are also provided below.

One or more embodiments described herein provide an architecture for one-transistor (1-T) ferroelectric FET based embedded non-volatile memory. To provide context, current state-of-art 1T FeFET memory cells based on silicon channel material with non-band engineered interfacial layers thereon are described for comparative purposes. In particular, FIG. 2 illustrates a schematic of a state-of-the-art ferroelectric field effect transistor (FeFET).

Figure 2:
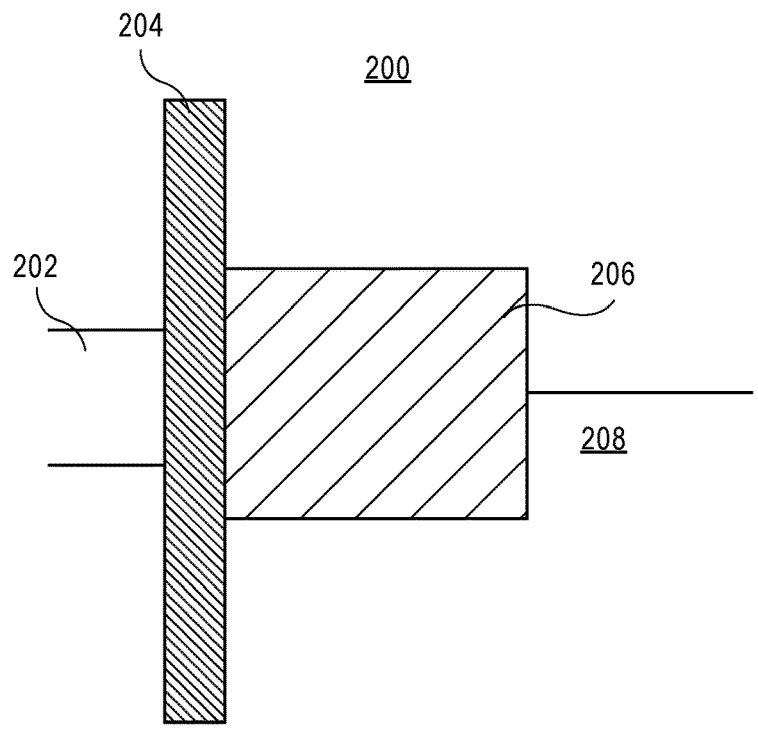
FIG. 2 illustrates a schematic of a state-of-the-art ferroelectric field effect transistor (FeFET).

Referring to FIG. 2, an arrangement for a state-of-the-art ferroelectric stack includes a silicon channel 202, an interfacial layer 204, a ferroelectric layer 206, and a gate electrode 208. In an example, the interfacial layer 204 is an $SiO_2$ layer or an SiON layer, the ferroelectric layer 206 is an $HfO_2$ layer having a net dipole, and the gate electrode 208 is a metal gate electrode, such as a titanium nitride gate electrode.

Figure 3:
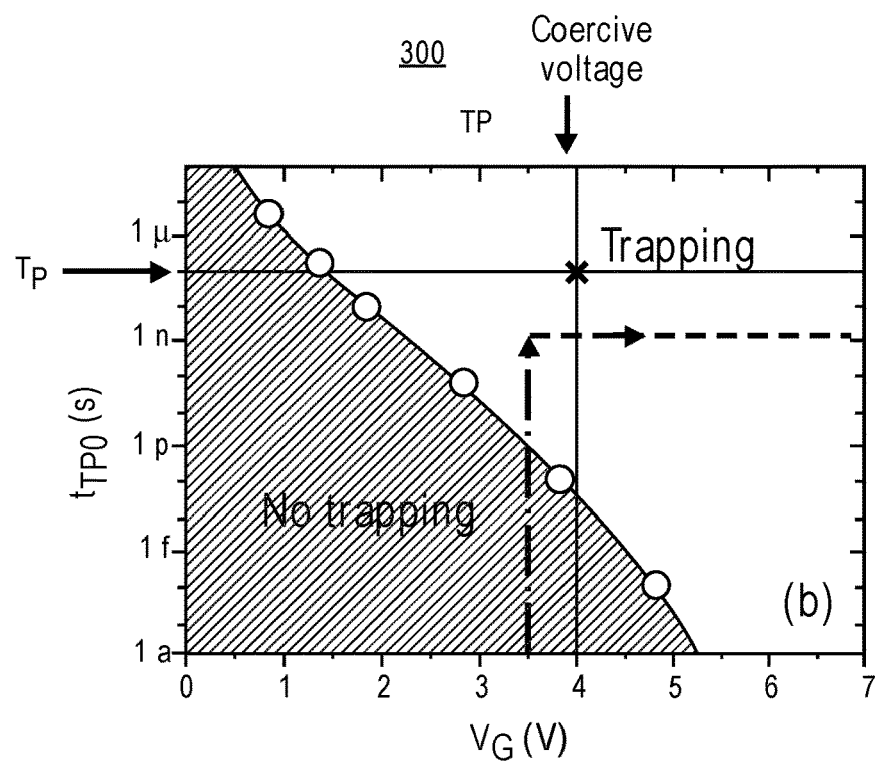
FIG. 3 is a plot showing significant band bending (capacitive coupling) causing increased charge trapping in a state-of-the-art ferroelectric stack

The material arrangement of the FeFET of FIG. 2 may be associated with critical charge trapping challenges. Such charge trapping issues may severely hinder programing as well as read operations of an FeFET, negatively impacting the development of FeFET-based non-volatile memory (NVM) for embedded or stand-alone memory. As demonstrated, FIG. 3 is a plot 300 showing significant band bending (capacitive coupling) causing increased charge trapping in a state-of-the-art ferroelectric stack. In some instances, such band bending can be sufficiently significant that the ferroelectric effect provided by the ferroelectric layer 206 is negated.

In accordance with one or more embodiments of the present disclosure, gate stack engineering for FeFETs is implemented. In one embodiment, a ferroelectric gate stack includes a metal oxide interfacial layer. The metal oxide interfacial layer may be included to circumvent charge trapping issues with, e.g., $HfO_2$-based ferroelectrics. More specifically, in one embodiment, device characteristics are optimized by engineering the interface between the ferroelectric material (e.g., hafnium oxide with a structure having a non-zero or net dipole) and the channel layer. In a particular embodiment, a metal oxide material is included at the interface between the ferroelectric material and the channel layer. The metal oxide material does not have a net dipole (no net dipole), i.e., the material is directionally electrically neutral in order to not interfere with the variable electrical directionality of the ferroelectric material thereon.

In an embodiment, a FeFET material stack includes a relatively wide bandgap and high-k interfacial layer between a ferroelectric material and a corresponding channel material. In one such embodiment, the relatively wide bandgap and high-k interfacial layer minimizes or altogether mitigates charge trapping concerns. Advantages of including such an interfacial layer may include one or more of minimal charge trapping, high endurance, high speed (e.g., no need to de-trap), voltage tunability for program/inhibit, and the ability to engineer interface dipoles to band-offset tuning.

In another aspect, as an exemplary processing scheme, FIGS. 4A-4F illustrate cross-sectional views of various stages in a method of fabricating a ferroelectric field effect transistor (FeFET), in accordance with an embodiment of the present disclosure.

Figure 4A:
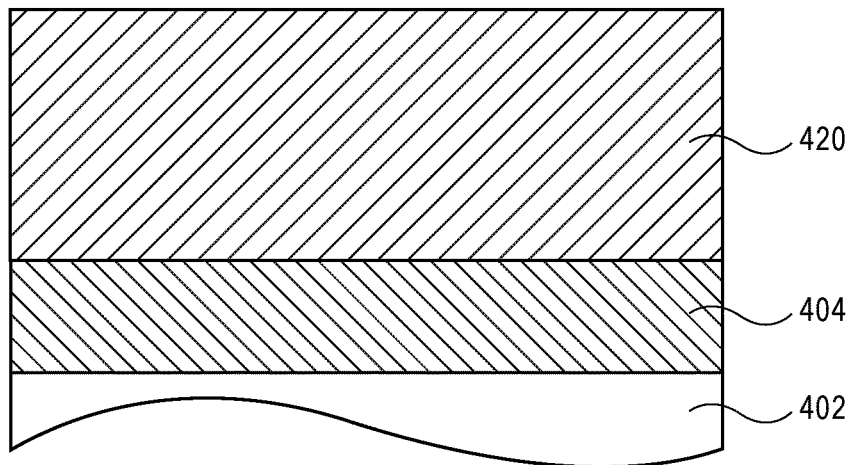
FIGS. 4A-4F illustrate cross-sectional views of various stages in a method of fabricating a ferroelectric field effect transistor (FeFET), in accordance with an embodiment of the present disclosure.

Referring to FIG. 4A, an insulating layer 420 is formed above a semiconductor material layer 404, such as a silicon layer, on or above a substrate 402.

Figure 4B:
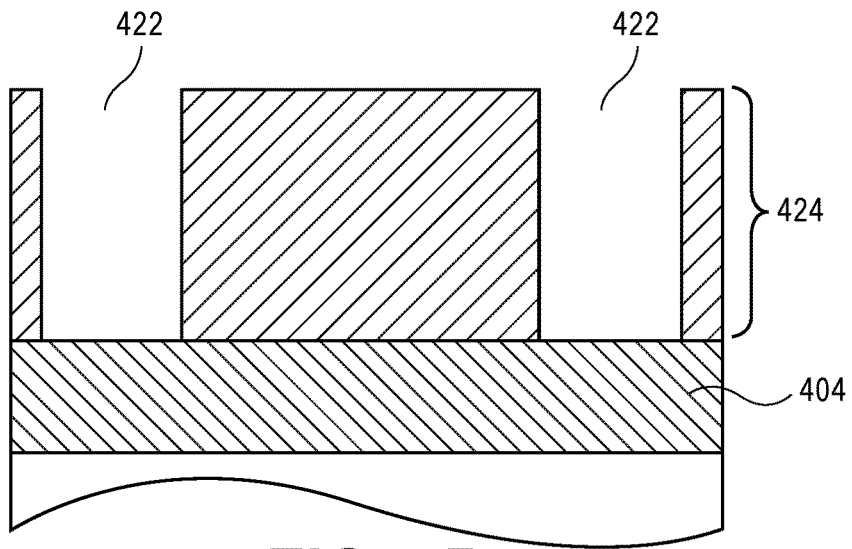

Referring to FIG. 4B, openings 422 are formed in the insulating layer 420 to provide first-patterned insulating layer 424.

Figure 4C:
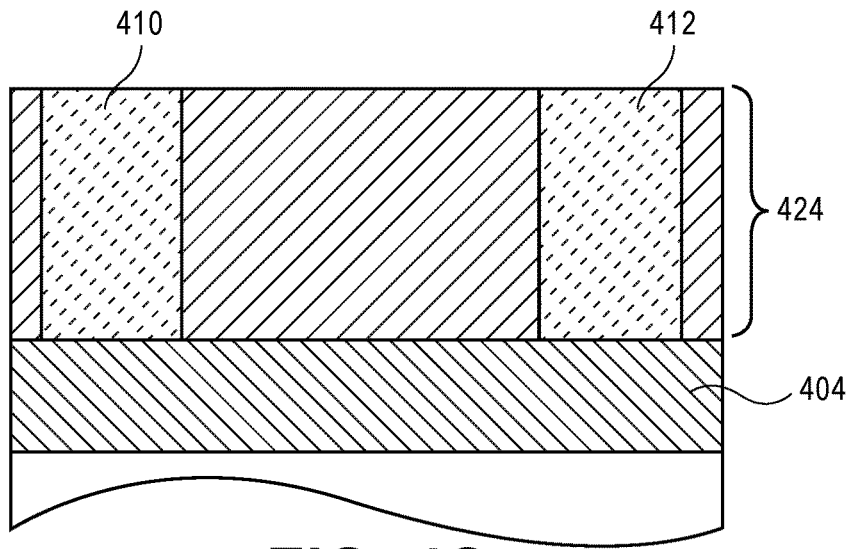

Referring to FIG. 4C, the openings 422 are filled with a semiconductor material to form first source/drain region 410 and second source/drain region 412, or are filled with a metal or metal alloy to form first source/drain contact 410 and second source/drain contact 412.

Figure 4D:
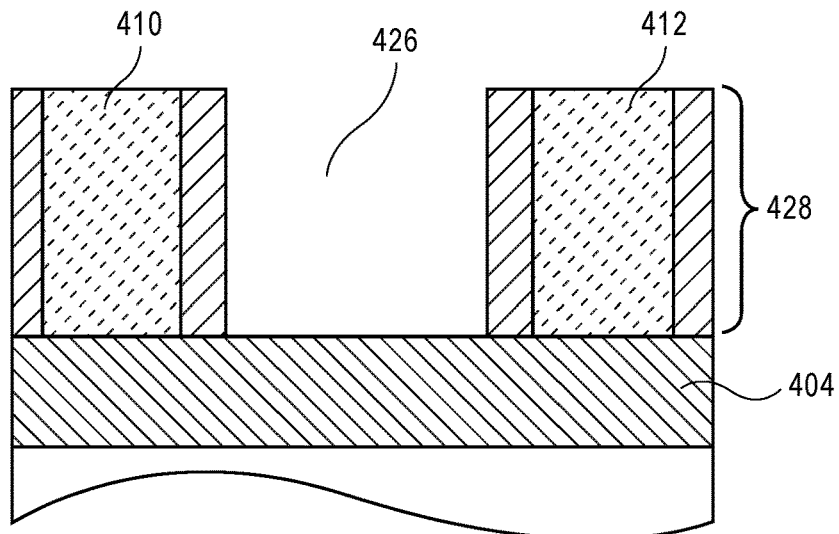

Referring to FIG. 4D, an opening 426 is formed in the first-patterned insulating layer 424 to provide second-patterned insulating layer 428.

Figure 4E:
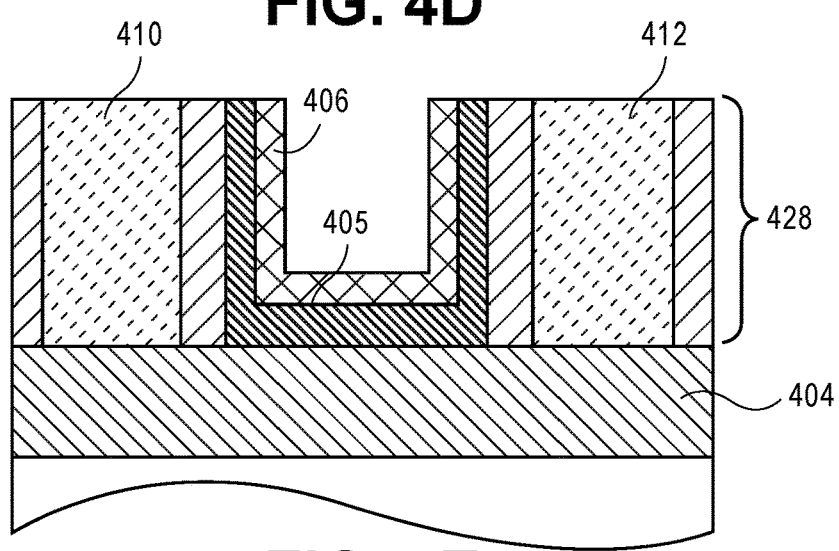

Referring to FIG. 4E, a metal oxide material 405 is first formed in the opening 426. In one embodiment, the metal oxide material 405 is further formed along the sidewalls of the opening 426, as is depicted. A ferroelectric material 406 is then formed in the opening 426, on the metal oxide material 405. In one embodiment, the ferroelectric material 406 is further formed along the sidewalls of the opening 426, as is also depicted.

Figure 4F:
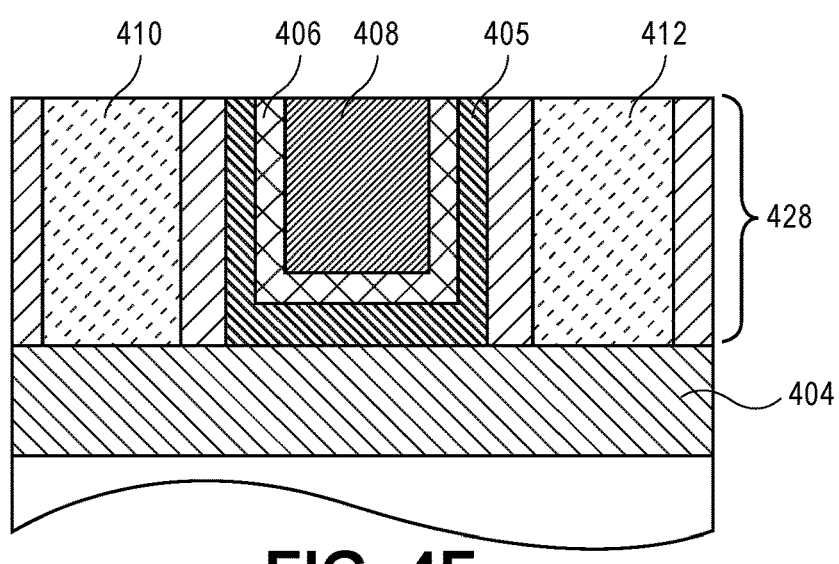

Referring to FIG. 4F, a gate electrode 408 is formed on the ferroelectric material 406. In one such embodiment, the gate electrode 408 is a metal gate electrode.

It is to be appreciated that non-planar geometries may also be contemplated within the scope of embodiments of the present disclosure. As a second exemplary ferroelectric field effect transistor structure, FIGS. 5A, 5B and 5C illustrate angled and direct cross-sectional views of a ferroelectric field effect transistor (FeFET), in accordance with an embodiment of the present disclosure.

Figure 5A:
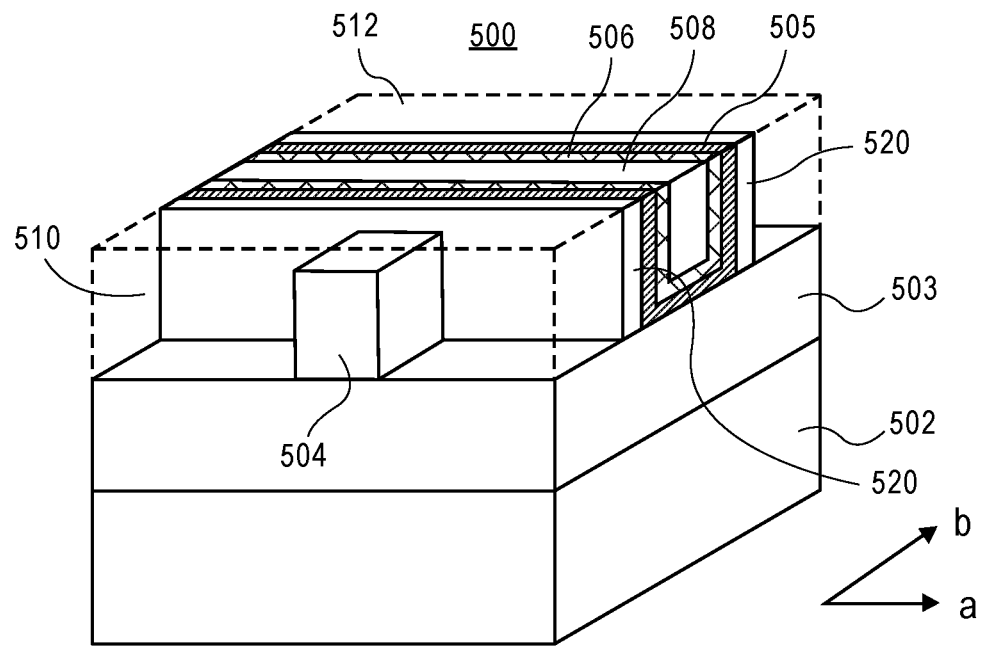
FIGS. 5A, 5B and 5C illustrate angled and direct cross-sectional views of a ferroelectric field effect transistor (FeFET), in accordance with an embodiment of the present disclosure.
Figure 5B:
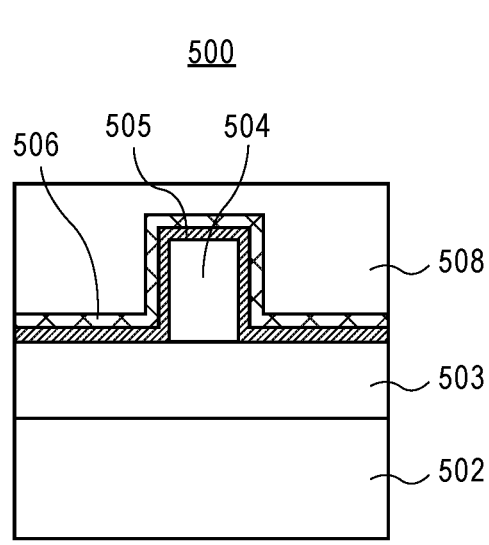
Figure 5C:
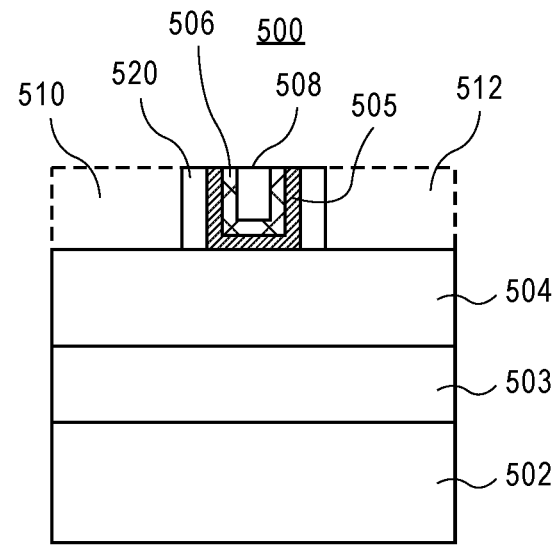

Referring to FIGS. 5A, 5B and 5C, an integrated circuit structure 500 includes a semiconductor fin 504 on or above a substrate 502. In one such embodiment, the semiconductor fin 504 is on an insulating layer 503 above a substrate 502. The semiconductor fin 504 has a top and sidewalls. A metal oxide material 505 is on the top and sidewalls of the semiconductor fin 504. In one embodiment, the metal oxide material 505 has no net dipole, as described above. A ferroelectric oxide material 506 is on the metal oxide material 506 on the top and sidewalls of the semiconductor fin 504. A gate electrode 508 is on the ferroelectric oxide material 506 above the top and laterally adjacent to the sidewalls of the semiconductor fin 504. The gate electrode 508 has a first side and a second side opposite the first side. A first source/drain region or source/drain contact 510 is at the first side of the gate electrode 508, and a second source/drain region or source/drain contact 512 is at the second side of the gate electrode 508.

In an embodiment, the semiconductor fin 504 is a single crystalline semiconductor fin, such as a single crystalline silicon fin. In another embodiment, the semiconductor fin 504 is an amorphous or a polycrystalline semiconductor fin, such as an amorphous or a polycrystalline silicon fin. In an embodiment, the metal oxide material 506 is selected from the group consisting of magnesium oxide, lanthanum aluminum oxide and aluminum oxide. In an embodiment, the material of the semiconductor fin 504 is a Group IV material system, such as silicon, silicon germanium, or germanium. In another embodiment, the material of the semiconductor fin 504 is a Group III-V material system, such as indium gallium arsenide (InGaAs).

In an embodiment, the ferroelectric oxide material 506 is selected from the group consisting of lead zirconate titanate (PZT), strontium bismuth tantalum oxide (SBT), and lanthanum-doped lead zirconium titanate (PLZT). In another embodiment, the ferroelectric oxide material 506 includes hafnium and oxygen. In one such embodiment, a hafnium oxide material having a structural geometry that provides for a switchable polarization direction is used as the ferroelectric oxide material 506.

In an embodiment, the integrated circuit structure 500 is a two-state memory cell, as described above. In another embodiment, the integrated circuit structure 500 further includes a non-volatile memory cell coupled to the second source/drain region 512, examples of which are provided below. In one such embodiment, the non-volatile memory cell is selected from the group consisting of a spin torque transfer random access memory (STTRAM) cell, a resistive random access memory (RRAM) cell, and a conductive bridge random access memory (CBRAM) cell, examples of which are also provided below.

In an embodiment, the integrated circuit structure 500 further includes a first dielectric spacer (left 520) between the first source/drain region or source/drain contact 510 and the first side of the gate electrode 508. A second dielectric spacer (right 520) is between the second source/drain region or source/drain contact 612 and the second side of the gate electrode 508, as is depicted in FIG. 5. In one such embodiment, the ferroelectric oxide material 506 and/or the metal oxide material 505 are further along the first and second dielectric spacers 520, as is also depicted in FIG. 5. In such a case, the ferroelectric oxide material 506 and/or the metal oxide material 505 may be described as having a "U"-shaped structure.

Figure 6A:
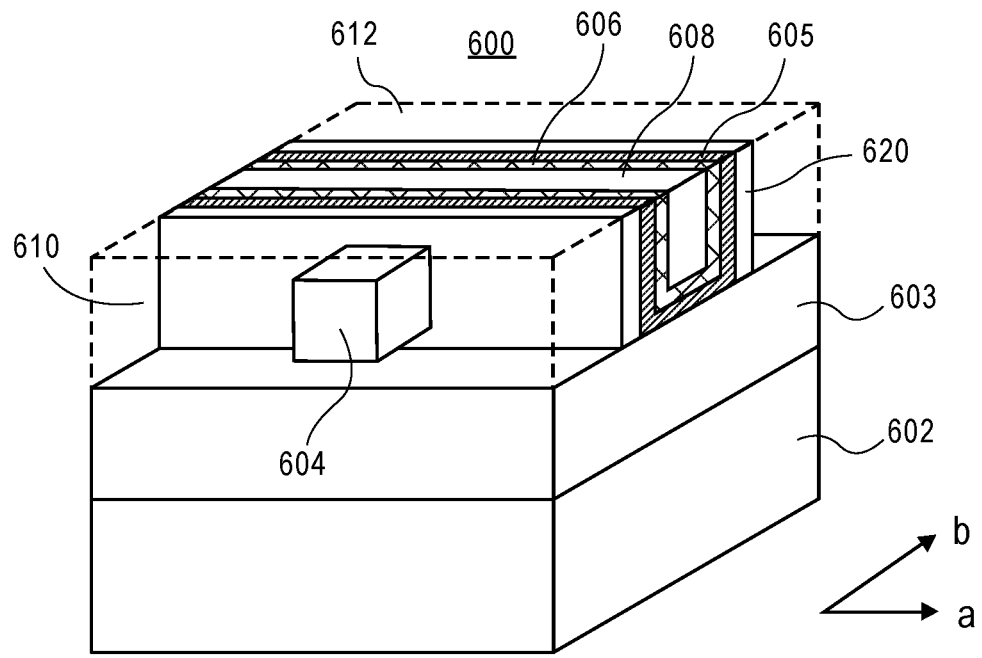
FIGS. 6A, 6B and 6C illustrate angled and direct cross-sectional views of a ferroelectric field effect transistor (FeFET), in accordance with an embodiment of the present disclosure.
Figure 6B:
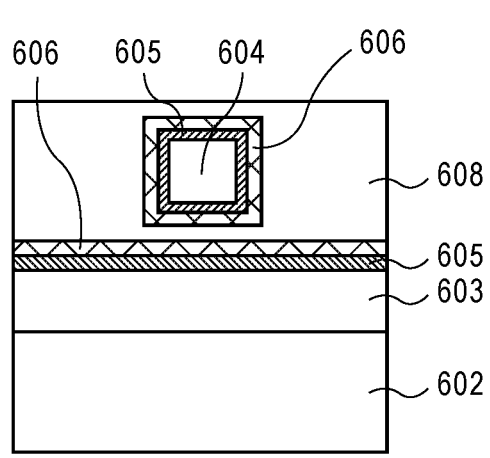
Figure 6C:
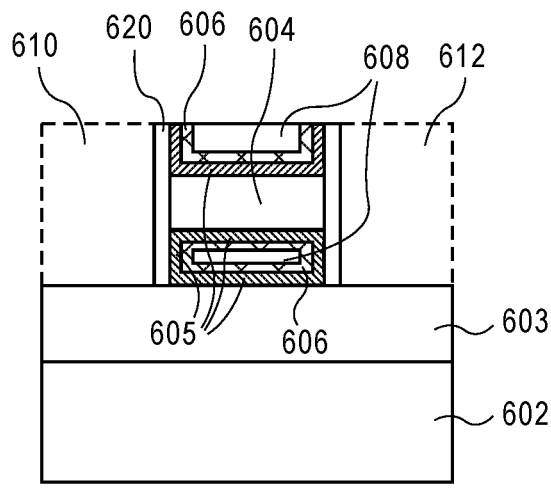

As a third exemplary ferroelectric field effect transistor structure, FIGS. 6A, 6B and 6C illustrate angled and direct cross-sectional views of a ferroelectric field effect transistor (FeFET), in accordance with an embodiment of the present disclosure.

Referring to FIGS. 6A, 6B and 6C, an integrated circuit structure 600 includes a semiconductor nanowire 604 above a substrate 602. In one such embodiment, the semiconductor nanowire 604 is above an insulating layer 603 above the substrate 602. The semiconductor nanowire 604 has a top, a bottom and sidewalls. A metal oxide material 605 is on the top, bottom and sidewalls of the semiconductor nanowire 604. In one embodiment, the metal oxide material 605 has no net dipole, as described above. A ferroelectric oxide material 606 is on the metal oxide material 605 on the top, bottom and sidewalls of the semiconductor nanowire 604. A gate electrode 608 is on the ferroelectric oxide material 606 above the top, below the bottom and laterally adjacent to the sidewalls of the semiconductor nanowire 604. The gate electrode 608 has a first side and a second side opposite the first side. A first source/drain region or source/drain contact 610 is at the first side of the gate electrode 608, and a second source/drain region or source/drain contact 612 is at the second side of the gate electrode 608.

In an embodiment, the semiconductor nanowire 604 is a single crystalline semiconductor fin, such as a single crystalline silicon fin. In another embodiment, the semiconductor nanowire 604 is an amorphous or a polycrystalline semiconductor fin, such as an amorphous or a polycrystalline silicon fin. In an embodiment, the metal oxide material 606 is selected from the group consisting of magnesium oxide, lanthanum aluminum oxide and aluminum oxide. In an embodiment, the material of the semiconductor nanowire 604 is a Group IV material system, such as silicon, silicon germanium, or germanium. In another embodiment, the material of the semiconductor nanowire 604 is a Group III-V material system, such as indium gallium arsenide (InGaAs).

In an embodiment, the ferroelectric oxide material 606 is selected from the group consisting of lead zirconate titanate (PZT), strontium bismuth tantalum oxide (SBT), and lanthanum-doped lead zirconium titanate (PLZT). In another embodiment, the ferroelectric oxide material 606 includes hafnium and oxygen. In one such embodiment, a hafnium oxide material having a structural geometry that provides for a switchable polarization direction is used as the ferroelectric oxide material 606.

In an embodiment, the integrated circuit structure 600 is a two-state memory cell, as described above. In another embodiment, the integrated circuit structure 600 further includes a non-volatile memory cell coupled to the second source/drain region 612, examples of which are provided below. In one such embodiment, the non-volatile memory cell is selected from the group consisting of a spin torque transfer random access memory (STTRAM) cell, a resistive random access memory (RRAM) cell, and a conductive bridge random access memory (CBRAM) cell, examples of which are also provided below.

In an embodiment, the integrated circuit structure 600 further includes a first dielectric spacer (left 620) between the first source/drain region or source/drain contact 610 and the first side of the gate electrode 608. A second dielectric spacer (right 620) is between the second source/drain region or source/drain contact 612 and the second side of the gate electrode 608, as is depicted in FIG. 6. In one such embodiment, the ferroelectric oxide material 606 and/or the metal oxide material 605 are further along the first and second dielectric spacers 620, as is also depicted in FIG. 6. In such a case, the ferroelectric oxide material 606 and/or the metal oxide material 605 may be described as having a "U"-shaped structure.

In an embodiment, the semiconductor nanowire 604 is sized as a wire or a ribbon, and may have squared-off or rounder corners. In one embodiment, the semiconductor nanowire 604 has a wire geometry having square-like or, if corner-rounded, circular geometry in cross-sectional view. In one embodiment, the semiconductor nanowire 604 has a ribbon geometry having rectangular-like or, if corner-rounded, oval-like in cross-section profile. In an embodiment, the dimensions of the semiconductor nanowire 604, from a cross-sectional perspective, are on the nano-scale. For example, in a specific embodiment, the smallest dimension of the semiconductor nanowire 604 is less than approximately 20 nanometers.

It is to be appreciated that the layers and materials described in association with embodiments herein are typically formed on or above an underlying semiconductor substrate 102, 402, 502, or 602 e.g., as FEOL layer(s). In other embodiments, the layers and materials described in association with embodiments herein are formed on or above underlying device layer(s) of an integrated circuit, e.g., as BEOL layer(s). In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, although not depicted, structures described herein may be fabricated on underlying lower level back end of line (BEOL) interconnect layers.

In the case that an insulator layer 503 or 603 is optionally used, the insulator layer 503 or 603 may be composed of a material suitable to ultimately electrically isolate, or contribute to the isolation of, portions of a gate structure from an underlying bulk substrate or interconnect layer. For example, in one embodiment, the insulator layer 503 or 603 is composed of a dielectric material such as, but not limited to, silicon dioxide, silicon oxy-nitride, silicon nitride, or carbon-doped silicon nitride. In a particular embodiment, the insulator layer 503 or 603 is a low-k dielectric layer of an underlying BEOL layer.

In an embodiment, gate electrode 108, 408, 508 or 608 includes at least one P-type work function metal or N-type work function metal, depending on whether the integrated circuit device 100/150, 500 or 600 is to be included in a P-type transistor or an N-type transistor. For a P-type transistors, metals that may be used for the gate electrode 108, 408, 508 or 608 may include, but are not limited to, ruthenium, palladium, platinum, cobalt, nickel, and conductive metal oxides (e.g., ruthenium oxide). For an N-type transistor, metals that may be used for the gate electrode 108, 408, 508 or 608 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode includes a stack of two or more metal layers, where one or more metal layers are work function metal layers and at least one metal layer is a fill metal layer. Further metal layers may be included for other purposes, such as to act as a barrier layer. In some implementations, the gate electrode 108, 408, 508 or 608 may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

Source/drain regions 110/112, 410/412, 510/512 or 610/612 may be formed within the corresponding channel material layer or structure. In one such embodiment, source/drain regions 110/112, 410/412, 510/512 or 610/612 are farmed using either an implantation/diffusion process or an etching/deposition process. In the former process, dopants may be ion-implanted into the channel material layer or structure. An annealing process that activates the dopants and causes them to diffuse further into the channel material layer or structure typically follows the ion implantation process. In the latter process, the channel material layer or structure may first be etched to form recesses at the locations of the source and drain regions. An epitaxial deposition process may then be carried out to fill the recesses with material that is used to fabricate the source and drain regions.

In other implementations, the regions 110/112, 410/412, 510/512 or 610/612 are referred to as source/drain regions contacts. In one such embodiment, one or more layers of metal and/or metal alloys are used to form the source and drain regions as conductive contacts on portions of the corresponding channel material layer or structure. In a particular embodiment, such source/drain conductive contacts are composed of aluminum or an aluminum-containing alloy.

In an embodiment, dielectric spacers 520 or 620 are formed from a material such as silicon nitride, silicon oxide, silicon carbide, silicon nitride doped with carbon, and silicon oxynitride. Processes for forming sidewall spacers are well known in the art and generally include deposition and etching process operations. In some embodiments, a plurality of spacer pairs is used. For example, two pairs, three pairs, or four pairs of sidewall spacers may be formed on opposing sides of the gate electrode 108, 508 or 608.

In an embodiment, integrated circuit device 100/150, 500 or 600 is included in an embedded non-volatile memory (eNVM) for 10 nanometer or smaller technology nodes and/or for system-on-chip (SoC) applications. In an embodiment, integrated circuit device 100/150, 500 or 600 is a low coercive field FeFET fabricated in a thin film, such as a thin silicon material formed in a BEOL layer. Embodiments described herein may be implemented to provide a high performance and highly scaled eNVM cell.

In another aspect, one or more embodiments of the present disclosure are directed to methods for integrating RAM memory arrays into a logic processor, such as spin torque transfer random access memory (STTRAM) arrays, resistive random access memory (RRAM) arrays, or conductive bridge random access memory (CBRAM) memory arrays. Particular embodiments may be suitable for fabricating embedded non-volatile memory (e-NVM). Approaches described herein may provide a fabrication pathway for high performance RAM cells and increase the potential of using scaled RAM cells for future e-NVM needs, such as for integration in system on chip (SoC) products.

In an embodiment, a conductive interconnect of an associated RAM element stack is coupled to a drain region of an underlying select FeFET transistor disposed on or above a substrate. As an example, FIG. 6 illustrates a cross-sectional view of a random access memory (RAM) element coupled to a drain side of a FeFET transistor selector, in accordance with an embodiment of the present disclosure.

Figure 7:
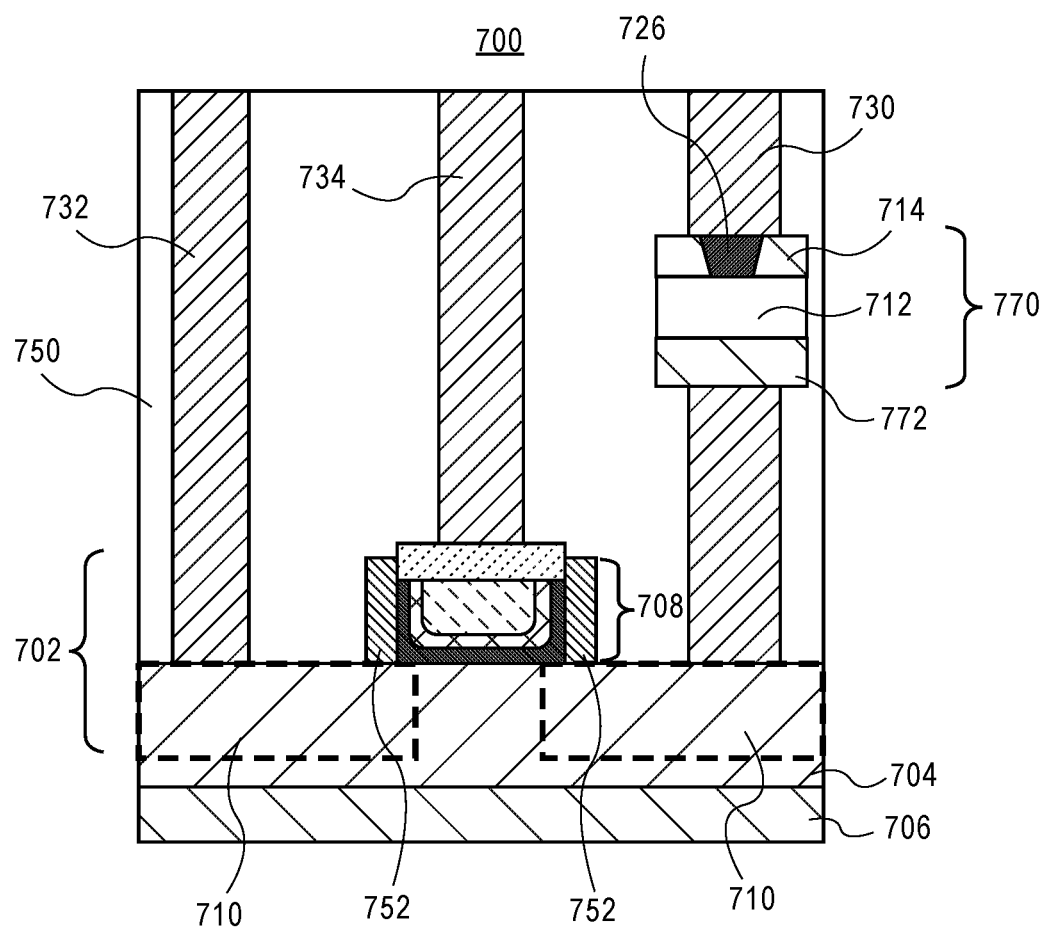
FIG. 7 illustrates a cross-sectional view of a random access memory (RAM) element coupled to a drain side of a FeFET transistor selector, in accordance with an embodiment of the present disclosure.

Referring to FIG. 7, a memory structure 700 includes an FeFET transistor 702 disposed in or above a semiconductor channel material region 704 on or above a semiconductor substrate 706. The FeFET transistor 702 includes a material stack 708 with source/drain regions 710 on either side of the material stack 708 and, in one embodiment, in the semiconductor channel material region 704. The material stack 708 includes a metal oxide material layer, a ferroelectric material layer, and one or more (one shown) gate electrode layers thereon. In an embodiment, the source/drain region 710 on the left-hand side of FIG. 7 is a source region, and the source/drain region 710 on the right-hand side of FIG. 7 is a drain region. An RAM element 770 is coupled to the drain region of the FeFET transistor 702, but not to the source region of the FeFET transistor 702. The arrangement enables driving of the RAM element 770 by the drain side only. The RAM element 770 and portions of the FeFET transistor 702 may be included in an inter-layer dielectric (ILD) layer or structure 750, as is depicted in FIG. 7. FeFET transistor 702 may be a planar transistor or a non-planar transistor including, but not limited to, a FinFET transistor, a double-gate transistor, a tri-gate transistor, or a wrap-around or all-around gate transistor such as a nanoribbon or nanowire transistor.

The RAM element 770 of FIG. 7 includes a lower electrode 772, a switching layer (or stack of layers including a switching layer) 712, and a top contact 726, which may be laterally surrounded by an insulating material 714, as is depicted in FIG. 7. In an embodiment, the RAM element 770 is, in an embodiment, included as an interrupting feature along a conductive drain contact 730, as is depicted. In one such embodiment, a corresponding gate contact 734 and a source contact 732 are not coupled to, or interrupted by the RAM element 770, as is depicted in FIG. 7. It is to be appreciated that although the RAM element 770 is shown generically along the drain contact 730 without a lateral reference, the actual layer in which the RAM element 770 is included may be viewed as an interconnect layer (e.g., M1, M2, M3, M4, etc.) corresponding to a logic region in another area of the substrate 706. Alternatively, FeFET transistor 702 may be included in a BEOL layer, either above or below the RAM element 770. It is also to be appreciated that additional interconnect layer(s) may be formed on top of the structure 700 shown in FIG. 7, e.g., using standard dual damascene process techniques that are well-known in the art.

In an embodiment, the RAM element 770 is a spin torque transfer random access memory (STTRAM) bit cell or element. In one such embodiment, the switching layer (or stack of layers including a switching layer) 712 is a stack of layers referred to as a magnetic tunnel junction (MTJ). In a specific such embodiment, the MTJ includes a fixed magnetic layer, a tunneling barrier layer, and a free magnetic layer. The MTJ may utilize a phenomenon known as tunneling magnetoresistance (TMR). For such a structure including two ferromagnetic layers separated by a thin insulating tunnel layer, it is more likely that electrons will tunnel through the tunnel material layer when magnetizations of the two magnetic layers are in a parallel orientation than if they are not (non-parallel or antiparallel orientation). As such, the MTJ can be switched between two states of electrical resistance, one state having a low resistance and one state with a high resistance. The greater the differential in resistance, the higher the TMR ratio. The higher the TMR ratio, the more readily a bit can be reliably stored in association with the MTJ resistive state. MTJs with magnetic electrodes having a perpendicular (out of plane of substrate) magnetic easy axis have a potential for realizing higher density memory than in-plane variants, and may be referred to a pMTJ. In some embodiments, then, the MTJ is a perpendicular system, where spins of the magnetic layers are perpendicular to the plane of the material layers (e.g., the magnetic easy axis is in the z-direction out of the plane of substrate).

In an embodiment, the fixed magnetic layer of the STTRAM bit cell or element is composed of a material or stack of materials suitable for maintaining a fixed magnetization direction while a free magnetic material layer is magnetically softer (e.g., magnetization can easily rotate to parallel and antiparallel state with respect to fixed layer). In an embodiment, the fixed magnetic layer is composed of a material or stack of materials suitable for maintaining a fixed majority spin. Thus, the fixed magnetic layer may be referred to as a ferromagnetic layer.

In one embodiment, the fixed magnetic layer is composed of a single layer of cobalt iron boron (CoFeB). However, in another embodiment, the fixed magnetic layer is composed of a cobalt iron boron (CoFeB) layer, ruthenium (Ru) layer, cobalt iron boron (CoFeB) layer stack. In an embodiment, a synthetic antiferromagnet (SAF) is disposed on or adjacent the fixed magnetic layer.

In an embodiment, the dielectric or tunneling layer of the STTRAM bit cell or element is composed of a material suitable for allowing current of a majority spin to pass through the layer, while impeding at least to some extent current of a minority spin to pass through the layer. Thus, the dielectric or tunneling layer (or spin filter layer) may be referred to as a tunneling layer. In one embodiment, the dielectric layer is composed of a material such as, but not limited to, magnesium oxide (MgO) or aluminum oxide ($Al_2O_3$). In one embodiment, the dielectric layer has a thickness of approximately 1 nanometer.

In an embodiment, the free magnetic layer of the STTRAM bit cell or element is composed of a material suitable for transitioning between a majority spin and a minority spin, depending on the application. Thus, the free magnetic layer (or memory layer) may be referred to as a ferromagnetic memory layer. In one embodiment, the free magnetic layer is composed of a layer of cobalt iron (CoFe) or cobalt iron boron (CoFeB).

In an embodiment, the MTJ functions essentially as a resistor, where the resistance of an electrical path through the MTJ may exist in two resistive states, either "high" or "low," depending on the direction or orientation of magnetization in the free magnetic layer and in the fixed magnetic layer. In the case that the spin direction is of minority in the free magnetic layer, a high resistive state exists, where direction of magnetization in the free magnetic layer and the fixed magnetic layer are substantially opposed or anti-parallel with one another. In the case that the spin direction is of majority in the free magnetic layer, a low resistive state exists, where the direction of magnetization in the free magnetic layer and the fixed magnetic layer is substantially aligned or parallel with one another. It is to be appreciated that the terms "low" and "high" with regard to the resistive state of the MTJ are relative to one another. In other words, the high resistive state is merely a detectibly higher resistance than the low resistive state, and vice versa. Thus, with a detectible difference in resistance, the low and high resistive states can represent different bits of information (i.e. a "0" or a "1").

Thus, the MTJ may store a single bit of information ("0" or "1") by its state of magnetization. The information stored in the MTJ is sensed by driving a current through the MTJ. The free magnetic layer does not require power to retain its magnetic orientations. As such, the state of the MTJ is preserved when power to the device is removed. Therefore, a memory bit cell 570 is, in an embodiment, non-volatile. In accordance with an embodiment of the present disclosure, each bit of data is stored in a separate magnetic tunnel junction (MTJ). To write information in a STT-MRAM device, the spin transfer torque effect is used to switch the free layer from the parallel to anti-parallel state and vice versa. The passing of current through the MTJ produces spin polarized current, which results in a torque being applied to the magnetization of the free layer. When the spin polarized current is sufficiently strong, enough torque is applied to the free layer to cause its magnetic orientation to change, thus allowing for bits to be written. To read the stored bit, sensing circuitry measures the resistance of the MTJ.

In an embodiment, the RAM element 770 is a resistive random access memory (RRAM) bit cell or element. Non-volatile memory based on resistance change is known as RRAM. In an embodiment, the switching layer 712 is an anionic-based conductive oxide layer. In one such embodiment, one electrode (lower electrode 772 or top contact 726) in a memory element including the anionic-based conductive oxide layer 712 is a noble metal based electrode, while the other electrode (top contact 726 or lower electrode 772, respectively) is a transition metal for which some of the lower valence oxides are conductive (e.g., to act as an oxygen reservoir). That is, when oxygen atoms migrate to the transition metal oxide, the resulting interfacial transition metal oxide formed remains conductive. Examples of suitable transition metals which form conductive oxides include but are not limited to, W, V, Cr, or Ir. In an embodiment, examples of suitable noble metals include, but are not limited to Pd or Pt. In other embodiments, one or both of the bottom electrode 772 and/or the top contact 726 is fabricated from an electro-chromic material. In other embodiments, one or both of the bottom electrode 772 and/or the top contact 726 is fabricated from a second, different conductive oxide material.

In an embodiment, for an RRAM bit cell or element, examples of suitable conductive oxides for switching layer 712 include, but are not limited to $HfO_x$ or $TaO_x$. In another embodiment, the conductive oxide layer is composed of a material with two or more metal elements (e.g., as contrasted to common RRAM memories using one metal such as found in binary oxides, such as $HfO_x$ or $TaO_x$). For example, in an embodiment, the switching layer 712 includes a material such as, but not limited to, ITO ($In_2O_{3-x}SnO_{2-x}$), $In_2O_{3-x}$, sub-stoichiometric yttria doped zirconia ($Y_2O_{3-x}ZrO_{2-x}$), or $La_{1-x}Sr_xGa_{1-y}Mg_yO_{3-X-0.5(x+y)}$. In such ternary, quaternary, etc. alloys, the metals used are from adjacent columns of the periodic table. Specific examples of suitable such conductive oxides include, but are not limited to: Y and Zr in $Y_2O_{3-x}ZrO_{2-x}$, In and Sn in $In_2O_{3-x}SnO_{2-x}$, or Sr and La in $La_{1-x}Sr_xGa_{1-y}Mg_yO_3$. Such materials may be viewed as compositions selected to have aliovalent substitution to significantly increase the number of oxygen vacancies.

In another embodiment, the RAM element 770 is a conductive bridge random access memory (CBRAM) bit cell or element. It is to be appreciated that CBRAM may be viewed as a specific type of resistive random access memory (RRAM). In a CBRAM device, a filament may be formed based on metallic migration into an electrolyte material which is the switching layer of the CBRAM device. By contrast, in conventional RRAM, a filament may be created based on oxygen vacancies.

In an embodiment, for a CBRAM bit cell or element, the resistance switching layer 712 is composed of a solid electrolyte material. An electrolyte or solid electrolyte, as used herein, refers to solid electrolyte material which is a solid substance that receives ions, provides ions, or can transport ions. In an exemplary embodiment, the solid electrolyte material is a chalcogenide material. In another embodiment, the resistance switching layer 712 is composed of a metal oxide, such as hafnium oxide.

In an embodiment, in the case of a CBRAM bit cell or element, the lower electrode 772 (or, alternatively, the top contact 726) is an active electrode layer. The active electrode layer may be a source of cations for filament formation or resistance change in the switching layer 712. In an embodiment, the active electrode layer includes a metal species such as, but not limited to, copper, silver, nickel, or lithium. In an embodiment, the top nano-contact 726 (or, alternatively, the lower electrode 772 in the case that the top contact 726 is an active electrode) is a passive electrode layer. The passive electrode layer may not be a source of cations for filament formation or resistance change in the switching layer 712. In an embodiment, the passive electrode layer includes a metal species such as, but not limited to, tungsten or platinum. In one embodiment, a metal nitride, such as a titanium nitride or a tantalum nitride layer, is used as the material for the passive electrode layer. In another embodiment, the passive electrode layer is composed of a noble metal such as, but not limited to Pd or Pt.

To provide further context, integrating memory directly onto a microprocessor chip may be advantageous since it enables higher operation speeds compared to having physically separate logic and memory chips. Unfortunately, traditional charge-based memory technologies such as DRAM and NAND Flash are now facing severe scalability issues related to increasingly precise charge placement and sensing requirements. As such, embedding charge-based memory directly onto a high performance logic chip is not very attractive for future technology nodes. However, a memory technology that does have the potential to scale to much smaller geometries compared to traditional charge-based memories includes one of STTRAM, RRAM, or CBRAM, since it relies on magnetic state or on resistivity rather than charge as the information carrier. However, in order to exploit the potential benefits of a high performance logic chip with embedded STTRAM memory, RRAM memory, or CBRAM memory, an appropriate integrated logic plus RAM structure and fabrication method is needed. Embodiments of the present disclosure include such structures and fabrication processes. Embodiments described may be advantageous for processing schemes involving the fabrication of logic processors with embedded memory arrays.

Figure 8:
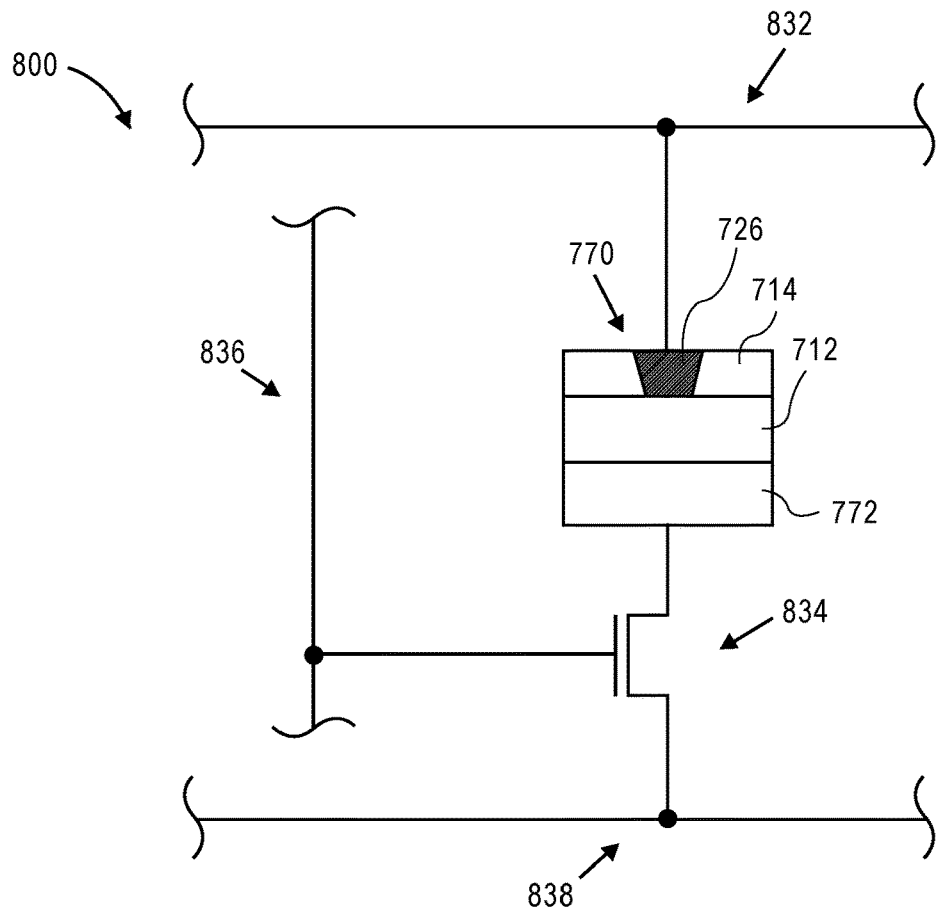
FIG. 8 illustrates a schematic of a memory bit cell which includes a RAM memory element, in accordance with an embodiment of the present disclosure.

It is to be appreciated that an RAM material stack and a FeFET device may be used to fabricate a memory bit cell. For example, FIG. 8 illustrates a schematic of a memory bit cell 800 which includes a random access memory (RAM) memory element 770, in accordance with an embodiment of the present disclosure. Such an RAM memory element may be suitable for manufacture on a substrate in common with logic regions of the substrate.

Referring to FIG. 8, the RAM memory element 770 includes the lower electrode 772 with the switching layer 712 (or stack of layers including a switching layer) above the lower electrode 772. A top contact 726 is above the switching layer 712 (or stack of layers including a switching layer), and may be laterally surrounded by the insulating material 714. It is to be appreciated that the RAM element 770 may include the material layers described in association with RAM element 770 described in association with FIG. 7. In an embodiment, the RAM memory element 770 is an STTRAM element, an RRAM element, or a CBRAM element.

The top contact 726 may be electrically connected to a bit line 832. The lower electrode 772 may be coupled with a FeFET integrated circuit structure 834, such as FeFET integrated circuit structure 100/150, 500 or 600. The FeFET integrated circuit structure 834 may be coupled with a wordline 836 and a source line 838 in a manner that will be appreciated by those skilled in the art. The memory bit cell 800 may further include additional read and write circuitry (not shown), a sense amplifier (not shown), a bit line reference (not shown), and the like, as will be appreciated by those skilled in the art, for the operation of the memory bit cell 800. It is to be appreciated that a plurality of the memory bit cells 800 may be operably connected to one another to form a memory array, where the memory array can be incorporated into a non-volatile memory region of a substrate in common with a logic region. It is to be appreciated that the FeFET integrated circuit structure 834 may be connected to the top contact 726 or the lower electrode 772, although only the latter is shown. Likewise, bit line 832 may be connected to the lower electrode 772 or the top contact 726, although only the latter is shown.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 9:
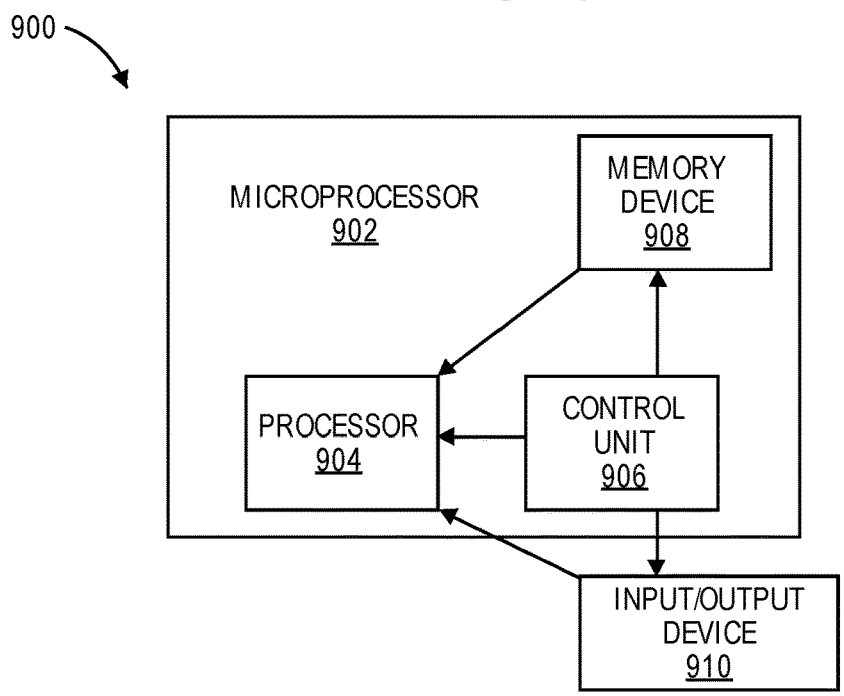
FIG. 9 illustrates a block diagram of an electronic system, in accordance with an embodiment of the present disclosure.

FIG. 9 illustrates a block diagram of an electronic system 900, in accordance with an embodiment of the present disclosure. The electronic system 900 can correspond to, for example, a portable system, a computer system, a process control system, or any other system that utilizes a processor and an associated memory. The electronic system 900 may include a microprocessor 902 (having a processor 904 and control unit 906), a memory device 908, and an input/output device 910 (it is to be appreciated that the electronic system 900 may have a plurality of processors, control units, memory device units and/or input/output devices in various embodiments). In one embodiment, the electronic system 900 has a set of instructions that define operations which are to be performed on data by the processor 904, as well as, other transactions between the processor 904, the memory device 908, and the input/output device 910. The control unit 906 coordinates the operations of the processor 904, the memory device 908 and the input/output device 910 by cycling through a set of operations that cause instructions to be retrieved from the memory device 908 and executed. The memory device 908 can include a non-volatile memory cell as described in the present description. In an embodiment, the memory device 908 is embedded in the microprocessor 902, as depicted in FIG. 9. In an embodiment, the processor 904, or another component of electronic system 900, includes one or more FeFETs, such as those described herein.

The integrated circuit structures described herein may be included in an electronic device. As a first example of an apparatus that may include one or more of the FeFETs disclosed herein, FIGS. 10A and 10B are top views of a wafer and dies that include one or more ferroelectric field effect transistors (FeFETs), in accordance with one or more of the embodiments disclosed herein.

Figure 10B:
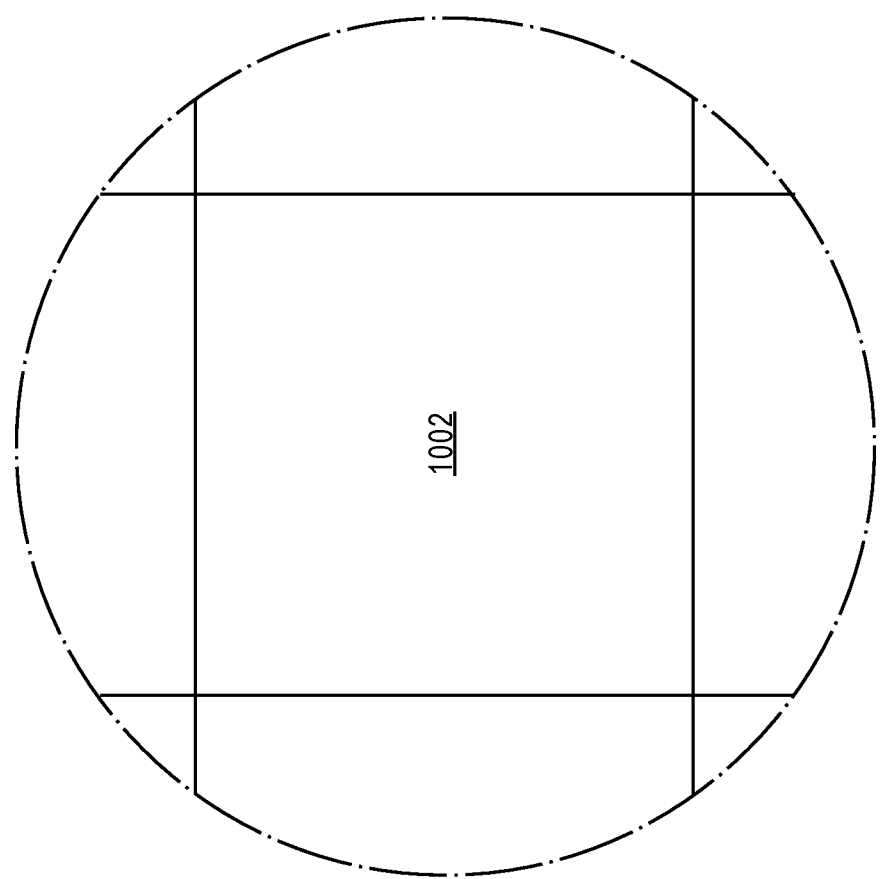
FIGS. 10A and 10B are top views of a wafer and dies that include one or more ferroelectric field effect transistors (FeFETs), in accordance with one or more of the embodiments disclosed herein.
Figure 10A:
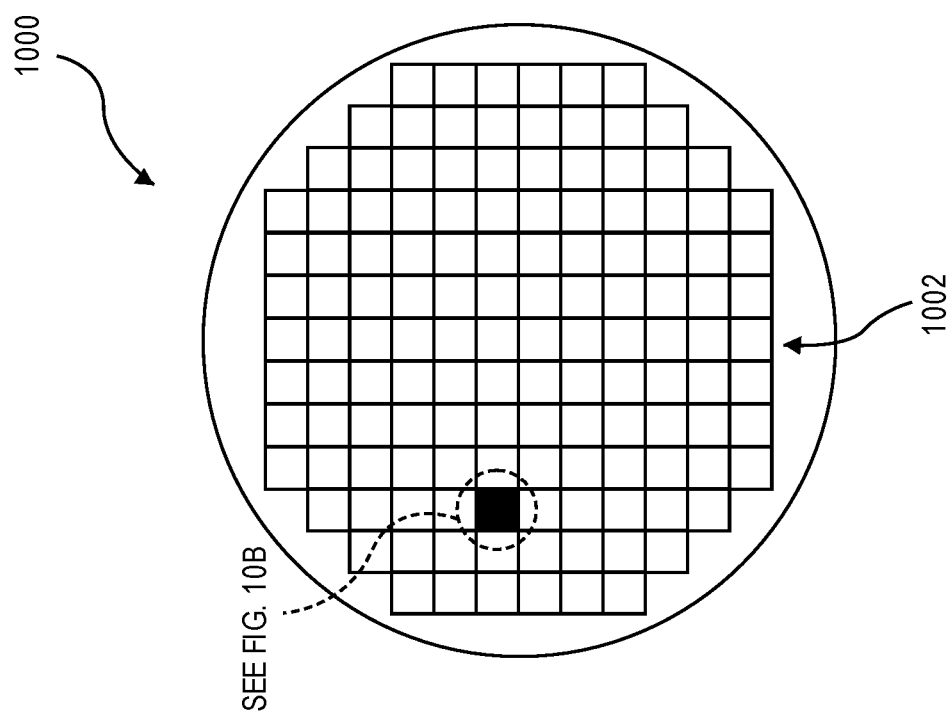

Referring to FIGS. 10A and 10B, a wafer 1000 may be composed of semiconductor material and may include one or more dies 1002 having integrated circuit (IC) structures formed on a surface of the wafer 1000. Each of the dies 1002 may be a repeating unit of a semiconductor product that includes any suitable IC (e.g., ICs including one or more structures such as FeFET integrated circuit structure 100/150, 500 or 600). After the fabrication of the semiconductor product is complete (e.g., after manufacture of FeFET integrated circuit structure 100/150, 500 or 600), the wafer 1000 may undergo a singulation process in which each of the dies 1002 is separated from one another to provide discrete "chips" of the semiconductor product. In particular, devices that include FeFETs as disclosed herein may take the form of the wafer 1000 (e.g., not singulated) or the form of the die 1002 (e.g., singulated). The die 1002 may include one or more FeFET transistors and/or supporting circuitry to route electrical signals to the transistors, as well as any other IC components. In some embodiments, the wafer 1000 or the die 1002 may include a memory device (e.g., a static random access memory (SRAM) device), a logic device (e.g., an AND, OR, NAND, or NOR gate), or any other suitable circuit element. Multiple ones of these devices may be combined on a single die 1002. For example, a memory array formed by multiple memory devices may be formed on a same die 1002 as a processing device or other logic that is configured to store information in the memory devices or execute instructions stored in the memory array.

Figure 11:
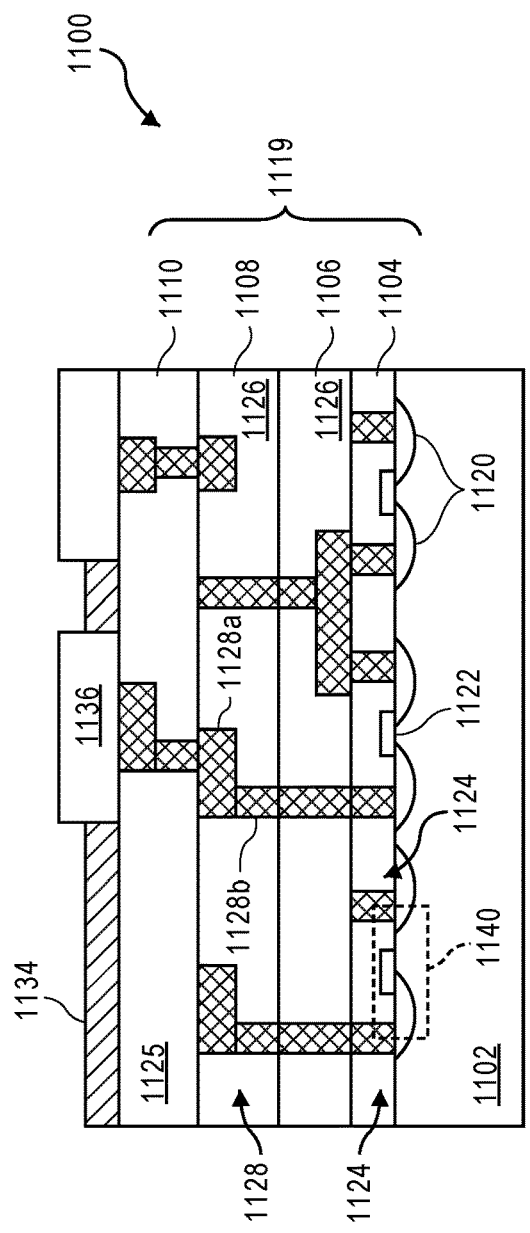
FIG. 11 is a cross-sectional side view of an integrated circuit (IC) device that may include one or more ferroelectric field effect transistors (FeFETs), in accordance with one or more of the embodiments disclosed herein.

FIG. 11 is a cross-sectional side view of an integrated circuit (IC) device that may include one or more ferroelectric field effect transistors (FeFETs), in accordance with one or more of the embodiments disclosed herein.

Referring to FIG. 11, an IC device 1100 is formed on a substrate 1102 (e.g., the wafer 1000 of FIG. 10A) and may be included in a die (e.g., the die 1002 of FIG. 10B), which may be singulated or included in a wafer. Although a few examples of materials from which the substrate 1102 may be formed are described above in association with substrate 102, 402, 502 or 602, any material that may serve as a foundation for an IC device 1100 may be used.

The IC device 1100 may include one or more device layers, such as device layer 1104, disposed on the substrate 1102. The device layer 1104 may include features of one or more transistors 1140 (e.g., FeFETs described above) formed on or above the substrate 1102. The device layer 1104 may include, for example, one or more source and/or drain (S/D) regions 1120, a gate 1122 to control current flow in the transistors 1140 between the S/D regions 1120, and one or more S/D contacts 1124 to route electrical signals to/from the S/D regions 1120. The transistors 1140 may include additional features not depicted for the sake of clarity, such as device isolation regions, gate contacts, and the like. The transistors 1140 are not limited to the type and configuration depicted in FIG. 11 and may include a wide variety of other types and configurations such as, for example, planar transistors, non-planar transistors, or a combination of both. Non-planar transistors may include Fin-based transistors, such as double-gate transistors or tri-gate transistors, and wrap-around or all-around gate transistors, such as nanoribbon and nanowire transistors. In particular, one or more of the transistors 1140 take the form of the transistors 100/150, 500 or 600. FeFETs such as 100/150, 500 or 600 may be particularly advantageous when used in the metal layers of a microprocessor device for analog circuitry, logic circuitry, or memory circuitry, and may be formed along with existing complementary metal oxide semiconductor (CMOS) processes.

Electrical signals, such as power and/or input/output (I/O) signals, may be routed to and/or from the transistors 1140 of the device layer 1104 through one or more interconnect layers disposed on the device layer 1104 (illustrated in FIG. 11 as interconnect layers 1106-1110). For example, electrically conductive features of the device layer 1104 (e.g., the gate 1122 and the S/D contacts 1124) may be electrically coupled with the interconnect structures 1128 of the interconnect layers 1106-1110. The one or more interconnect layers 1106-1110 may form an interlayer dielectric (ILD) stack 1119 of the IC device 1100.

The interconnect structures 1128 may be arranged within the interconnect layers 1106-1110 to route electrical signals according to a wide variety of designs (in particular, the arrangement is not limited to the particular configuration of interconnect structures 1128 depicted in FIG. 11). Although a particular number of interconnect layers 1106-1110 is depicted in FIG. 11, embodiments of the present disclosure include IC devices having more or fewer interconnect layers than depicted.

In some embodiments, the interconnect structures 1128 may include trench structures 1128a (sometimes referred to as "lines") and/or via structures 1128b filled with an electrically conductive material such as a metal. The trench structures 1128a may be arranged to route electrical signals in a direction of a plane that is substantially parallel with a surface of the substrate 1102 upon which the device layer 1104 is formed. For example, the trench structures 1128a may route electrical signals in a direction in and out of the page from the perspective of FIG. 11. The via structures 1128b may be arranged to route electrical signals in a direction of a plane that is substantially perpendicular to the surface of the substrate 1102 upon which the device layer 1104 is formed. In some embodiments, the via structures 1128b may electrically couple trench structures 1128a of different interconnect layers 1106-1110 together. The interconnect layers 1106-1110 may include a dielectric material 1126 disposed between the interconnect structures 1128, as shown in FIG. 11. In some embodiments, the dielectric material 1126 disposed between the interconnect structures 1128 in different ones of the interconnect layers 1106-1110 may have different compositions; in other embodiments, the composition of the dielectric material 1126 between different interconnect layers 1106-1110 may be the same. In either case, such dielectric materials may be referred to as interlayer dielectric (ILD) materials.

A first interconnect layer 1106 (referred to as Metal 1 or "M1") may be formed directly on the device layer 1104. In some embodiments, the first interconnect layer 1106 may include trench structures 1128a and/or via structures 1128b, as shown. The trench structures 1128a of the first interconnect layer 1106 may be coupled with contacts (e.g., the S/D contacts 1124) of the device layer 1104.

A second interconnect layer 1108 (referred to as Metal 2 or "M2") may be formed directly on the first interconnect layer 1106. In some embodiments, the second interconnect layer 1108 may include via structures 1128b to couple the trench structures 1128a of the second interconnect layer 1108 with the trench structures 1128a of the first interconnect layer 1106. Although the trench structures 1128a and the via structures 1128b are structurally delineated with a line within each interconnect layer (e.g., within the second interconnect layer 1108) for the sake of clarity, the trench structures 1128a and the via structures 1128b may be structurally and/or materially contiguous (e.g., simultaneously filled during a dual-damascene process) in some embodiments.

A third interconnect layer 1110 (referred to as Metal 3 or "M3") (and additional interconnect layers, as desired) may be formed in succession on the second interconnect layer 1108 according to similar techniques and configurations described in connection with the second interconnect layer 1108 or the first interconnect layer 1106.

The IC device 1100 may include a solder resist material 1134 (e.g., polyimide or similar material) and one or more bond pads 1136 formed on the interconnect layers 1106-1110. The bond pads 1136 may be electrically coupled with the interconnect structures 1128 and configured to route the electrical signals of the transistor(s) 1140 to other external devices. For example, solder bonds may be formed on the one or more bond pads 1136 to mechanically and/or electrically couple a chip including the IC device 1100 with another component (e.g., a circuit board). The IC device 1100 may have other alternative configurations to route the electrical signals from the interconnect layers 1106-1110 than depicted in other embodiments. For example, the bond pads 1136 may be replaced by or may further include other analogous features (e.g., posts) that route the electrical signals to external components.

Figure 12:
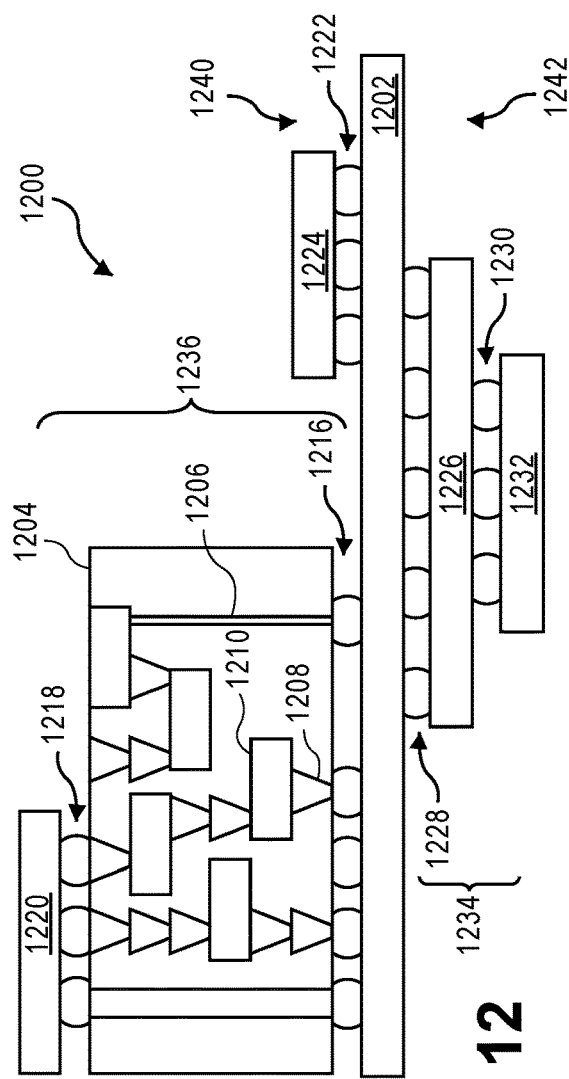
FIG. 12 is a cross-sectional side view of an integrated circuit (IC) device assembly that may include one or more ferroelectric field effect transistors (FeFETs), in accordance with one or more of the embodiments disclosed herein.

FIG. 12 is a cross-sectional side view of an integrated circuit (IC) device assembly that may include one or more ferroelectric field effect transistors (FeFETs), in accordance with one or more of the embodiments disclosed herein.

Referring to FIG. 12, an IC device assembly 1200 includes components having one or more integrated circuit structures described herein. The IC device assembly 1200 includes a number of components disposed on a circuit board 1202 (which may be, e.g., a motherboard). The IC device assembly 1200 includes components disposed on a first face 1240 of the circuit board 1202 and an opposing second face 1242 of the circuit board 1202. Generally, components may be disposed on one or both faces 1240 and 1242. In particular, any suitable ones of the components of the IC device assembly 1200 may include a number of the FeFET integrated circuit structures 100/150, 500 or 600 disclosed herein.

In some embodiments, the circuit board 1202 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1202. In other embodiments, the circuit board 1202 may be a non-PCB substrate.

The IC device assembly 1200 illustrated in FIG. 12 includes a package-on-interposer structure 1236 coupled to the first face 1240 of the circuit board 1202 by coupling components 1216. The coupling components 1216 may electrically and mechanically couple the package-on-interposer structure 1236 to the circuit board 1202, and may include solder balls (as shown in FIG. 12), male and female portions of a socket, an adhesive, an underfill material, and/or any other suitable electrical and/or mechanical coupling structure.

The package-on-interposer structure 1236 may include an IC package 1220 coupled to an interposer 1204 by coupling components 1218. The coupling components 1218 may take any suitable form for the application, such as the forms discussed above with reference to the coupling components 1216. Although a single IC package 1220 is shown in FIG. 12, multiple IC packages may be coupled to the interposer 1204. It is to be appreciated that additional interposers may be coupled to the interposer 1204. The interposer 1204 may provide an intervening substrate used to bridge the circuit board 1202 and the IC package 1220. The IC package 1220 may be or include, for example, a die (the die 1002 of FIG. 10B), an IC device (e.g., the IC device 1100 of FIG. 11), or any other suitable component. Generally, the interposer 1204 may spread a connection to a wider pitch or reroute a connection to a different connection. For example, the interposer 1204 may couple the IC package 1220 (e.g., a die) to a ball grid array (BGA) of the coupling components 1216 for coupling to the circuit board 1202. In the embodiment illustrated in FIG. 12, the IC package 1220 and the circuit board 1202 are attached to opposing sides of the interposer 1204. In other embodiments, the IC package 1220 and the circuit board 1202 may be attached to a same side of the interposer 1204. In some embodiments, three or more components may be interconnected by way of the interposer 1204.

The interposer 1204 may be formed of an epoxy resin, a fiberglass-reinforced epoxy resin, a ceramic material, or a polymer material such as polyimide. In some implementations, the interposer 1204 may be formed of alternate rigid or flexible materials that may include the same materials described above for use in a semiconductor substrate, such as silicon, germanium, and other group III-V and group IV materials. The interposer 1204 may include metal interconnects 1208 and vias 1210, including but not limited to through-silicon vias (TSVs) 1206. The interposer 1204 may further include embedded devices 1214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 1204. The package-on-interposer structure 1236 may take the form of any of the package-on-interposer structures known in the art.

The IC device assembly 1200 may include an IC package 1224 coupled to the first face 1240 of the circuit board 1202 by coupling components 1222. The coupling components 1222 may take the form of any of the embodiments discussed above with reference to the coupling components 1216, and the IC package 1224 may take the form of any of the embodiments discussed above with reference to the IC package 1220.

The IC device assembly 1200 illustrated in FIG. 12 includes a package-on-package structure 1234 coupled to the second face 1242 of the circuit board 1202 by coupling components 1228. The package-on-package structure 1234 may include an IC package 1226 and an IC package 1232 coupled together by coupling components 1230 such that the IC package 1226 is disposed between the circuit board 1202 and the IC package 1232. The coupling components 1228 and 1230 may take the form of any of the embodiments of the coupling components 1216 discussed above, and the IC packages 1226 and 1232 may take the form of any of the embodiments of the IC package 1220 discussed above. The package-on-package structure 1234 may be configured in accordance with any of the package-on-package structures known in the art.

In an embodiment, interconnect lines (and, possibly, underlying via structures) described herein are composed of one or more metal or metal-containing conductive structures. The conductive interconnect lines are also sometimes referred to in the art as traces, wires, lines, metal, interconnect lines or simply interconnects. In a particular embodiment, each of the interconnect lines includes a barrier layer and a conductive fill material. In an embodiment, the barrier layer is composed of a metal nitride material, such as tantalum nitride or titanium nitride. In an embodiment, the conductive fill material is composed of a conductive material such as, but not limited to, Cu, Al, Ti, Zr, Hf, V, Ru, Co, Ni, Pd, Pt, W, Ag, Au or alloys thereof.

Interconnect lines described herein may be fabricated as a grating structure, where the term "grating" is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have conductive lines spaced at a constant pitch and having a constant width. The pattern may be fabricated by a pitch halving or pitch quartering, or other pitch division, approach.

In an embodiment, ILD materials described herein are composed of or include a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, lithographic operations are performed using 193 nm immersion lithography (i193), extreme ultra-violet (EUV) and/or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

It is to be appreciated that not all aspects of the processes described above need be practiced to fall within the spirit and scope of embodiments of the present disclosure. Also, the processes described herein may be used to fabricate one or a plurality of semiconductor devices. One or more embodiments may be particularly useful for fabricating semiconductor devices at a 10 nanometer (10 nm) or smaller technology node.

Figure 13:
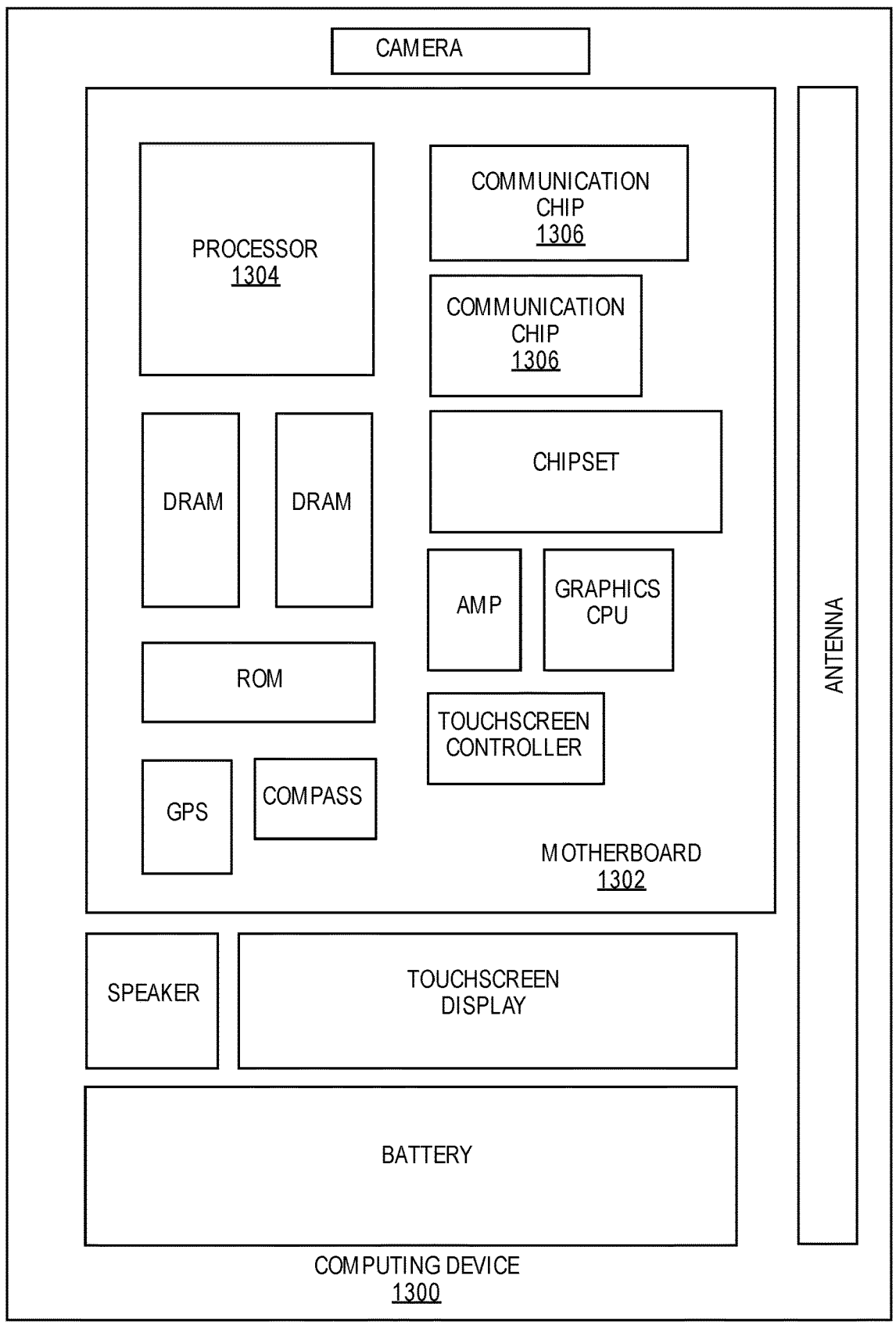
FIG. 13 illustrates a computing device in accordance with one implementation of an embodiment of the disclosure.

FIG. 13 illustrates a computing device 1300 in accordance with one implementation of the disclosure. The computing device 1300 houses a board 1302. The board 1302 may include a number of components, including but not limited to a processor 1304 and at least one communication chip 1306. The processor 1304 is physically and electrically coupled to the board 1302. In some implementations the at least one communication chip 1306 is also physically and electrically coupled to the board 1302. In further implementations, the communication chip 1306 is part of the processor 1304.

Depending on its applications, computing device 1300 may include other components that may or may not be physically and electrically coupled to the board 1302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1306 enables wireless communications for the transfer of data to and from the computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1300 may include a plurality of communication chips 1306. For instance, a first communication chip 1306 may be dedicated to shorter range wireless communications such as Wi-Fi and Bluetooth and a second communication chip 1306 may be dedicated to longer range wireless communications such as GPS, EDGE, GPRS, CDMA, WiMAX, LTE, Ev-DO, and others.

The processor 1304 of the computing device 1300 includes an integrated circuit die packaged within the processor 1304. In some implementations of the disclosure, the integrated circuit die of the processor includes one or more ferroelectric field effect transistors (FeFETs), in accordance with implementations of embodiments of the disclosure. The term "processor" may refer to any device or portion of a device that processes electronic data from registers and/or memory to transform that electronic data into other electronic data that may be stored in registers and/or memory.

The communication chip 1306 also includes an integrated circuit die packaged within the communication chip 1306. In accordance with another implementation of embodiments of the disclosure, the integrated circuit die of the communication chip includes one or more ferroelectric field effect transistors (FeFETs), in accordance with implementations of embodiments of the disclosure.

In further implementations, another component housed within the computing device 1300 may contain an integrated circuit die that includes one or more ferroelectric field effect transistors (FeFETs), in accordance with implementations of embodiments of the disclosure.

In various implementations, the computing device 1300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Thus, embodiments described herein include ferroelectric field effect transistors (FeFETs) having band-engineered interface layers.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a semiconductor channel layer above a substrate. A metal oxide material is on the semiconductor channel layer, the metal oxide material having no net dipole. A ferroelectric oxide material is on the metal oxide material. A gate electrode is on the ferroelectric oxide material, the gate electrode having a first side and a second side opposite the first side. A first source/drain region is at the first side of the gate electrode, and a second source/drain region is at the second side of the gate electrode.

Example embodiment 2: The integrated circuit structure of example embodiment 1, wherein the metal oxide material is selected from the group consisting of magnesium oxide, lanthanum aluminum oxide and aluminum oxide.

Example embodiment 3: The integrated circuit structure of example embodiment 1 or 2, wherein the semiconductor channel layer is a single crystalline semiconductor channel layer.

Example embodiment 4: The integrated circuit structure of example embodiment 1 or 2, wherein the semiconductor channel layer is an amorphous or a polycrystalline semiconductor channel layer.

Example embodiment 5: The integrated circuit structure of example embodiment 1, 2, 3 or 4, wherein the ferroelectric oxide material is selected from the group consisting of lead zirconate titanate (PZT), strontium bismuth tantalum oxide (SBT), and lanthanum-doped lead zirconium titanate (PLZT).

Example embodiment 6: The integrated circuit structure of example embodiment 1, 2, 3 or 4, wherein the ferroelectric oxide material includes hafnium and oxygen.

Example embodiment 7: The integrated circuit structure of example embodiment 1, 2, 3, 4, 5 or 6, wherein the integrated circuit structure is a two-state memory cell.

Example embodiment 8: The integrated circuit structure of example embodiment 1, 2, 3, 4, 5 or 6, further including a non-volatile memory cell coupled to the second source/drain region, the non-volatile memory cell selected from the group consisting of a spin torque transfer random access memory (STTRAM) cell, a resistive random access memory (RRAM) cell, and a conductive bridge random access memory (CBRAM) cell.

Example embodiment 9: An integrated circuit structure includes a semiconductor fin above a substrate, the semiconductor fin having a top and sidewalls. A metal oxide material is on the top and sidewalls of the semiconductor fin, the metal oxide material having no net dipole. A ferroelectric oxide material is on the metal oxide material on the top and sidewalls of the semiconductor fin. A gate electrode is on the ferroelectric oxide material above the top and laterally adjacent to the sidewalls of the semiconductor fin, the gate electrode having a first side and a second side opposite the first side. A first source/drain region is at the first side of the gate electrode, and a second source/drain region is at the second side of the gate electrode.

Example embodiment 10: The integrated circuit structure of example embodiment 9, wherein the metal oxide material is selected from the group consisting of magnesium oxide, lanthanum aluminum oxide and aluminum oxide.

Example embodiment 11: The integrated circuit structure of example embodiment 9 or 10, wherein the semiconductor fin is a single crystalline semiconductor fin.

Example embodiment 12: The integrated circuit structure of example embodiment 9 or 10, wherein the semiconductor fin is an amorphous or a polycrystalline semiconductor fin.

Example embodiment 13: The integrated circuit structure of example embodiment 9, 10, 11 or 12, wherein the ferroelectric oxide material is selected from the group consisting of lead zirconate titanate (PZT), strontium bismuth tantalum oxide (SBT), and lanthanum-doped lead zirconium titanate (PLZT).

Example embodiment 14: The integrated circuit structure of example embodiment 9, 10, 11 or 12, wherein the ferroelectric oxide material includes hafnium and oxygen.

Example embodiment 15: The integrated circuit structure of example embodiment 9, 10, 11, 12, 13 or 14, wherein the integrated circuit structure is a two-state memory cell.

Example embodiment 16: The integrated circuit structure of example embodiment 9, 10, 11, 12, 13 or 14, further including a non-volatile memory cell coupled to the second source/drain region, the non-volatile memory cell selected from the group consisting of a spin torque transfer random access memory (STTRAM) cell, a resistive random access memory (RRAM) cell, and a conductive bridge random access memory (CBRAM) cell.

Example embodiment 17: An integrated circuit structure includes a semiconductor nanowire above a substrate, the semiconductor nanowire having a top, a bottom and sidewalls. A metal oxide material is on the top, bottom and sidewalls of the semiconductor nanowire, the metal oxide material having no net dipole. A ferroelectric oxide material is on the metal oxide material on the top, bottom, and sidewalls of the semiconductor nanowire. A gate electrode is on the ferroelectric oxide material above the top, below the bottom and laterally adjacent to the sidewalls of the semiconductor nanowire, the gate electrode having a first side and a second side opposite the first side. A first source/drain region is at the first side of the gate electrode, and a second source/drain region is at the second side of the gate electrode.

Example embodiment 18: The integrated circuit structure of example embodiment 17, wherein the metal oxide material is selected from the group consisting of magnesium oxide, lanthanum aluminum oxide and aluminum oxide.

Example embodiment 19: The integrated circuit structure of example embodiment 17 or 18, wherein the semiconductor nanowire is a single crystalline semiconductor nanowire.

Example embodiment 20: The integrated circuit structure of example embodiment 17 or 18, wherein the semiconductor nanowire is an amorphous or a polycrystalline semiconductor nanowire.

Example embodiment 21: The integrated circuit structure of example embodiment 17, 18, 19 or 20, wherein the ferroelectric oxide material is selected from the group consisting of lead zirconate titanate (PZT), strontium bismuth tantalum oxide (SBT), and lanthanum-doped lead zirconium titanate (PLZT).

Example embodiment 22: The integrated circuit structure of example embodiment 17, 18, 19 or 20, wherein the ferroelectric oxide material includes hafnium and oxygen.

Example embodiment 23: The integrated circuit structure of example embodiment 17, 18, 19, 20, 21 or 22, wherein the integrated circuit structure is a two-state memory cell.

Example embodiment 24: The integrated circuit structure of example embodiment 17, 18, 19, 20, 21 or 22, further including a non-volatile memory cell coupled to the second source/drain region, the non-volatile memory cell selected from the group consisting of a spin torque transfer random access memory (STTRAM) cell, a resistive random access memory (RRAM) cell, and a conductive bridge random access memory (CBRAM) cell.

What is claimed is:

1. An integrated circuit structure, comprising:
   a semiconductor channel layer above a substrate;
   an insulating layer intervening between the semiconductor channel layer and the substrate, wherein the semiconductor channel layer is directly on the insulating layer;
   a metal oxide material on the semiconductor channel layer, the metal oxide material having no net dipole, and the metal oxide material having an uppermost surface;
   a ferroelectric oxide material on the metal oxide material, the ferroelectric oxide material having an uppermost surface co-planar with the uppermost surface of the metal oxide material;
   a gate electrode on the ferroelectric oxide material, the gate electrode having a first side and a second side opposite the first side, wherein a portion of the ferroelectric oxide material is on the first side and the second side of the gate electrode, wherein a portion of the metal oxide material is on the portion of the ferroelectric oxide material on the first side and the second side of the gate electrode, and wherein the gate electrode has an uppermost surface co-planar with the uppermost surface of the ferroelectric oxide material;
   a first source/drain region at the first side of the gate electrode; and
   a second source/drain region at the second side of the gate electrode.

2. The integrated circuit structure of claim 1, wherein the metal oxide material is selected from the group consisting of magnesium oxide, lanthanum aluminum oxide and aluminum oxide.

3. The integrated circuit structure of claim 1, wherein the semiconductor channel layer is a single crystalline semiconductor channel layer.

4. The integrated circuit structure of claim 1, wherein the semiconductor channel layer is an amorphous or polycrystalline semiconductor channel layer.

5. The integrated circuit structure of claim 1, wherein the ferroelectric oxide material is selected from the group consisting of lead zirconate titanate (PZT), strontium bismuth tantalum oxide (SBT), and lanthanum-doped lead zirconium titanate (PLZT).

6. The integrated circuit structure of claim 1, wherein the ferroelectric oxide material comprises hafnium and oxygen.

7. The integrated circuit structure of claim 1, wherein the integrated circuit structure is a two-state memory cell.

8. The integrated circuit structure of claim 1, further comprising:
   a non-volatile memory cell coupled to the second source/drain region, the non-volatile memory cell selected from the group consisting of a spin torque transfer random access memory (STTRAM) cell, a resistive random access memory (RRAM) cell, and a conductive bridge random access memory (CBRAM) cell.

9. An integrated circuit structure, comprising:
   a semiconductor fin above a substrate, the semiconductor fin having a top and sidewalls;
   an insulating layer intervening between the semiconductor fin and the substrate, wherein the semiconductor fin is directly on the insulating layer;
   a metal oxide material on the top and sidewalls of the semiconductor fin, the metal oxide material having no net dipole, and the metal oxide material having an uppermost surface;
   a ferroelectric oxide material on the metal oxide material on the top and sidewalls of the semiconductor fin, the ferroelectric oxide material having an uppermost surface co-planar with the uppermost surface of the metal oxide material;
   a gate electrode on the ferroelectric oxide material above the top and laterally adjacent to the sidewalls of the semiconductor fin, the gate electrode having a first side and a second side opposite the first side, wherein a portion of the ferroelectric oxide material is on the first side and the second side of the gate electrode, wherein a portion of the metal oxide material is on the portion of the ferroelectric oxide material on the first side and the second side of the gate electrode, and wherein the gate electrode has an uppermost surface co-planar with the uppermost surface of the ferroelectric oxide material;

a first source/drain region at the first side of the gate electrode; and a second source/drain region at the second side of the gate electrode.

10. The integrated circuit structure of claim 9, wherein the metal oxide material is selected from the group consisting of magnesium oxide, lanthanum aluminum oxide and aluminum oxide.

11. The integrated circuit structure of claim 9, wherein the semiconductor fin is a single crystalline semiconductor fin.

12. The integrated circuit structure of claim 9, wherein the semiconductor fin is an amorphous or polycrystalline semiconductor fin.

13. The integrated circuit structure of claim 9, wherein the ferroelectric oxide material is selected from the group consisting of lead zirconate titanate (PZT), strontium bismuth tantalum oxide (SBT), and lanthanum-doped lead zirconium titanate (PLZT).

14. The integrated circuit structure of claim 9, wherein the ferroelectric oxide material comprises hafnium and oxygen.

15. The integrated circuit structure of claim 9, wherein the integrated circuit structure is a two-state memory cell.

16. The integrated circuit structure of claim 9, further comprising:

a non-volatile memory cell coupled to the second source/drain region, the non-volatile memory cell selected from the group consisting of a spin torque transfer random access memory (STTRAM) cell, a resistive random access memory (RRAM) cell, and a conductive bridge random access memory (CBRAM) cell.

17. An integrated circuit structure, comprising:

a semiconductor nanowire above a substrate, the semiconductor nanowire having a top, a bottom and sidewalls;

a metal oxide material on the top, bottom and sidewalls of the semiconductor nanowire, the metal oxide material having no net dipole, and the metal oxide material having an uppermost surface;

a ferroelectric oxide material on the metal oxide material on the top, bottom and sidewalls of the semiconductor nanowire, the ferroelectric oxide material having an uppermost surface co-planar with the uppermost surface of the metal oxide material;

a gate electrode on the ferroelectric oxide material above the top, below the bottom and laterally adjacent to the sidewalls of the semiconductor nanowire, the gate electrode having a first side and a second side opposite the first side, wherein a portion of the ferroelectric oxide material is on the first side and the second side of the gate electrode, wherein a portion of the metal oxide material is on the portion of the ferroelectric oxide material on the first side and the second side of the gate electrode, and wherein the gate electrode has an uppermost surface co-planar with the uppermost surface of the ferroelectric oxide material;

a first source/drain region at the first side of the gate electrode; and a second source/drain region at the second side of the gate electrode.

18. The integrated circuit structure of claim 17, wherein the metal oxide material is selected from the group consisting of magnesium oxide, lanthanum aluminum oxide and aluminum oxide.

19. The integrated circuit structure of claim 17, wherein the semiconductor nanowire is a single crystalline semiconductor nanowire.

20. The integrated circuit structure of claim 17, wherein the semiconductor nanowire is an amorphous or polycrystalline semiconductor nanowire.

21. The integrated circuit structure of claim 17, wherein the ferroelectric oxide material is selected from the group consisting of lead zirconate titanate (PZT), strontium bismuth tantalum oxide (SBT), and lanthanum-doped lead zirconium titanate (PLZT).

22. The integrated circuit structure of claim 17, wherein the ferroelectric oxide material comprises hafnium and oxygen.

23. The integrated circuit structure of claim 17, wherein the integrated circuit structure is a two-state memory cell.

24. The integrated circuit structure of claim 17, further comprising:

a non-volatile memory cell coupled to the second source/drain region, the non-volatile memory cell selected from the group consisting of a spin torque transfer random access memory (STTRAM) cell, a resistive random access memory (RRAM) cell, and a conductive bridge random access memory (CBRAM) cell.

* * * * *